(12) United States Patent
Zi et al.

(10) Patent No.: US 12,469,692 B2
(45) Date of Patent: Nov. 11, 2025

(54) CLEANING SOLUTION AND METHOD OF CLEANING WAFER

(71) Applicant: TAIWAN SEMICONDUCTOR MANUFACTURING COMPANY, LTD., Hsinchu (TW)

(72) Inventors: An-Ren Zi, Hsinchu (TW); Ching-Yu Chang, Yuansun Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 449 days.

(21) Appl. No.: 17/853,833

(22) Filed: Jun. 29, 2022

(65) Prior Publication Data

US 2022/0351963 A1 Nov. 3, 2022

Related U.S. Application Data

(62) Division of application No. 16/780,791, filed on Feb. 3, 2020, now Pat. No. 11,456,170.

(Continued)

(51) Int. Cl.
*H01L 21/02* (2006.01)
*C11D 1/02* (2006.01)
(Continued)

(52) U.S. Cl.
CPC .......... *H01L 21/02057* (2013.01); *C11D 1/02* (2013.01); *C11D 1/66* (2013.01); *C11D 1/72* (2013.01); *C11D 3/43* (2013.01); *C11D 11/0047* (2013.01); *H01L 21/02041* (2013.01); *H01L 21/02052* (2013.01); *H01L 21/0206* (2013.01); *H01L 21/0274* (2013.01); *H01L 21/308* (2013.01); *G03F 7/16* (2013.01); *G03F 7/20* (2013.01); *G03F 7/30* (2013.01); *G03F 7/422* (2013.01)

(58) Field of Classification Search
None
See application file for complete search history.

(56) References Cited

U.S. PATENT DOCUMENTS

| | | | |
|---|---|---|---|
| 7,063,930 | B2 | 6/2006 | Chai et al. |
| 7,977,039 | B2 | 7/2011 | Shimoaoki et al. |

(Continued)

FOREIGN PATENT DOCUMENTS

| | | |
|---|---|---|
| CN | 1585914 A | 2/2005 |
| CN | 1302342 C | 2/2007 |

(Continued)

OTHER PUBLICATIONS

Non-Final Office Action issued in U.S. Appl. No. 16/780,791, dated Dec. 8, 2020.

(Continued)

*Primary Examiner* — Stephanie P Duclair
(74) *Attorney, Agent, or Firm* — STUDEBAKER & BRACKETT PC

(57) ABSTRACT

A cleaning solution includes a solvent having Hansen solubility parameters: $25>\delta_d>13$, $25>\delta_p>3$, $30>\delta_h>4$; an acid having an acid dissociation constant pKa: $-11<pKa<4$, or a base having pKa of $40>pKa>9.5$; and a surfactant.

20 Claims, 16 Drawing Sheets

Related U.S. Application Data

(60) Provisional application No. 62/834,212, filed on Apr. 15, 2019.

(51) Int. Cl.

| | | |
|---|---|---|
| *C11D 1/66* | (2006.01) | |
| *C11D 1/72* | (2006.01) | |
| *C11D 3/43* | (2006.01) | |
| *C11D 11/00* | (2006.01) | |
| *G03F 7/16* | (2006.01) | |
| *G03F 7/20* | (2006.01) | |
| *G03F 7/30* | (2006.01) | |
| *G03F 7/42* | (2006.01) | |
| *H01L 21/027* | (2006.01) | |
| *H01L 21/308* | (2006.01) | |

(56) References Cited

U.S. PATENT DOCUMENTS

| | | |
|---|---|---|
| 8,647,445 B1 | 2/2014 | Chhabra et al. |
| 2007/0072092 A1 | 3/2007 | Shimoaoki et al. |
| 2009/0192065 A1* | 7/2009 | Korzenski ............... G03F 7/425 |
| | | 510/176 |
| 2011/0027995 A1 | 2/2011 | Ishibashi |
| 2011/0160112 A1 | 6/2011 | Chang et al. |
| 2012/0108485 A1* | 5/2012 | Kamimura ............. C11D 3/046 |
| | | 510/176 |
| 2017/0200601 A1 | 7/2017 | Song et al. |
| 2018/0039182 A1 | 2/2018 | Zi et al. |
| 2018/0040474 A1 | 2/2018 | Zi et al. |

FOREIGN PATENT DOCUMENTS

| | | |
|---|---|---|
| CN | 101063065 A | 10/2007 |
| CN | 107155367 A | 9/2017 |
| TW | 201619363 A | 6/2016 |
| WO | 2019/067923 A2 | 4/2019 |

OTHER PUBLICATIONS

Final Office Action issued in U.S. Appl. No. 16/780,791, dated Jun. 7, 2021.

Non-Final Office Action issued in U.S. Appl. No. 16/780,791, dated Oct. 4, 2021.

Notice of Allowance issued in U.S. Appl. No. 16/780,791, dated Mar. 31, 2022.

* cited by examiner

CLEANING SOLUTION AND METHOD OF CLEANING WAFER

CROSS-REFERENCE TO RELATED APPLICATIONS

This application is a Divisional Application of U.S. application Ser. No. 16/780,791, filed Feb. 3, 2020, which claims priority to U.S. Provisional Patent Application No. 62/834,212, filed Apr. 15, 2019, the entire disclosures of each of which are incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As the semiconductor device sizes continue to shrink, for example below 20 nanometer (nm) nodes, traditional lithography technologies have optical restrictions, which leads to resolution issues and may not achieve the desired lithography performance. In comparison, extreme ultraviolet (EUV) lithography can achieve much smaller device sizes. However, conventional EUV lithography still has some shortcomings, for example, shortcomings with respect to EUV photo absorption and/or contamination caused by metal-containing materials. As a result, semiconductor fabrication performance may be compromised or degraded.

Therefore, while existing systems and method for performing EUV lithography have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
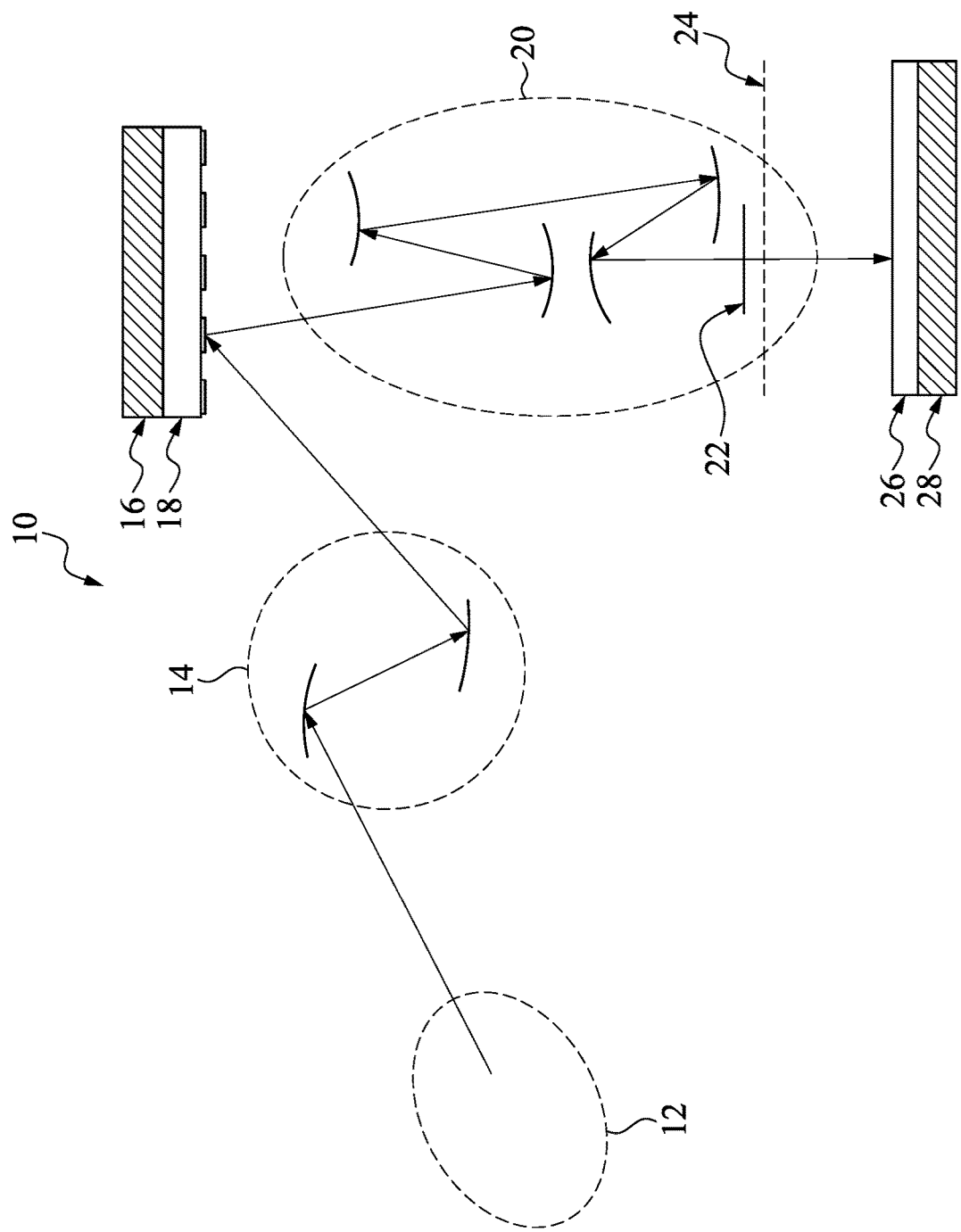
FIG. 1 is a schematic view of a lithography system constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Extreme ultraviolet (EUV) lithography has become widely used due to its ability to achieve small semiconductor device sizes. However, conventional systems and methods of performing EUV lithography may have shortcomings. For example, conventional photoresist materials are typically organic materials. These organic materials may not be optimized for photon absorption in the EUV range. Thus, metal-containing materials may be added to photoresist materials for EUV lithography. However, these metal-containing materials may cause potential contamination problems. For example, if the metal-containing materials are not properly washed away or otherwise removed from the EUV photolithography apparatus or the wafer undergoing EUV lithography, they could cause contamination for subsequent semiconductor fabrication processes where metal is not needed (or desired), or they could contaminate other semiconductor fabrication tools as the wafer is transferred between the various semiconductor fabrication tools. The contamination due to the metal-containing materials in the EUV photoresist may therefore cause semiconductor fabrication problems and/or degrade semiconductor device performance.

To overcome the problems discussed above, the present disclosure provides a novel solvent and a novel system and method of using the solvent to effectively clean the metal-containing materials (in EUV photoresist) off of the wafer. The various aspects of the present disclosure will be discussed below in greater detail with reference to FIGS. 1-10. First, an EUV lithography system will be discussed below with reference to FIGS. 1 and 2. Next, the details of a cleaning system and method according to embodiments of the present disclosure are discussed with reference to FIGS. 3-10.

FIG. 1 is a schematic view diagram of an EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates a EUV light with a wavelength centered at about 13.5 nm. Accordingly, the radiation source 12 is also referred to as an EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for an EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the mask 18. In one example, the mirrors of the illuminator 14 are switchable to reflect EUV light to different illumination positions. In some embodiments, a stage prior to the illuminator 14 includes other switchable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence a being at most 0.3 is employed. In some other embodiments, the illuminator 14 is configured to provide an off-axis illumination (OAI) to the mask 18. In an example, the illuminator 14 is a dipole illuminator. The dipole illuminator has a partial coherence a of at most 0.3 in some embodiments.

The lithography system 10 also includes a mask stage 16 configured to secure a mask 18. In some embodiments, the mask stage 16 includes an electrostatic chuck (e-chuck) to secure the mask 18. Because gas molecules absorb EUV light the lithography system for the EUV lithography patterning is maintained in a vacuum environment to avoid the EUV intensity loss. In the disclosure, the terms of mask, photomask, and reticle are used interchangeably to refer to the same item.

In the present embodiment, the lithography system 10 is an EUV lithography system, and the mask 18 is a reflective mask. The mask 18 includes a substrate with a suitable material, such as a low thermal expansion material (LTEM) or fused quartz. In various embodiments, the LTEM includes $TiO_2$ doped $SiO_2$, or other suitable materials with low thermal expansion.

The mask 18 also includes a reflective multilayer (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 18 may further include a capping layer, such as ruthenium (Ru), disposed on the ML for protection. The mask 18 further includes an absorption layer deposited over the ML. The absorption layer is patterned to define a layer of an integrated circuit (IC). Alternatively, another reflective layer may be deposited over the ML and is patterned to define a layer of an integrated circuit, thereby forming a EUV phase shift mask.

The lithography system 10 also includes a projection optics module (or projection optics box (POB) 20 for imaging the pattern of the mask 18 on to a semiconductor substrate 26 secured on a substrate stage 28 of the lithography system 10. The POB 20 has refractive optics (such as for an UV lithography system) or alternatively reflective optics (such as for an EUV lithography system) in various embodiments. The light directed from the mask 18, diffracted into various diffraction orders and carrying the image of the pattern defined on the mask, is collected by the POB 20. The POB 20 may include a magnification of less than one (thereby the size of the "image" on a target (such as target 26 discussed below) is smaller than the size of the corresponding "object" on the mask). The illuminator 14 and the POB 20 are collectively referred to as an optical module of the lithography system 10.

In some embodiments, the lithography system 10 also includes a pupil phase modulator 22 to modulate the optical phase of the light directed from the mask 18 so that the light has a phase distribution on a projection pupil plane 24. In the optical module, there is a plane with a field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane 24. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter is limited in some lithography system (such as an EUV lithography system) since all materials absorb EUV light.

As discussed above, the lithography system 10 also includes the substrate stage 28 to secure a target 26 to be patterned, such as a semiconductor substrate. In some embodiments, the semiconductor substrate is a semiconductor wafer, such as a silicon wafer or other type of wafer. The target 26 is coated with the resist layer sensitive to the radiation beam, such as EUV light in the present embodiment. Various components including those described above are integrated together and are operable to perform lithography exposing processes. The lithography system 10 may further include other modules or be integrated with (or be coupled with) other modules.

The mask 18 and the method of making the same are further described in accordance with some embodiments. In some embodiments, the mask fabrication process includes two operations: a blank mask fabrication process and a mask patterning process. During the blank mask fabrication process, a blank mask is formed by depositing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

The mask 18 includes a suitable structure, such as a binary intensity mask (BIM) and phase-shifting mask (PSM) in various embodiments. An exemplary BIM includes absorptive regions (also referred to as opaque regions) and reflective regions, patterned to define an IC pattern to be transferred to the target. In the opaque regions, an absorber is present, and an incident light is almost fully absorbed by the absorber. In the reflective regions, the absorber is removed and the incident light is diffracted by a multilayer (ML). The PSM can be an attenuated PSM (AttPSM) or an alternating PSM (AltPSM). An exemplary PSM includes a first reflective layer (such as a reflective ML) and a second reflective layer patterned according to an IC pattern. In some examples, an AttPSM usually has a reflectivity of 2%-15% from its absorber, while an AltPSM usually has a reflectivity of larger than 50% from its absorber.

Figure 2:
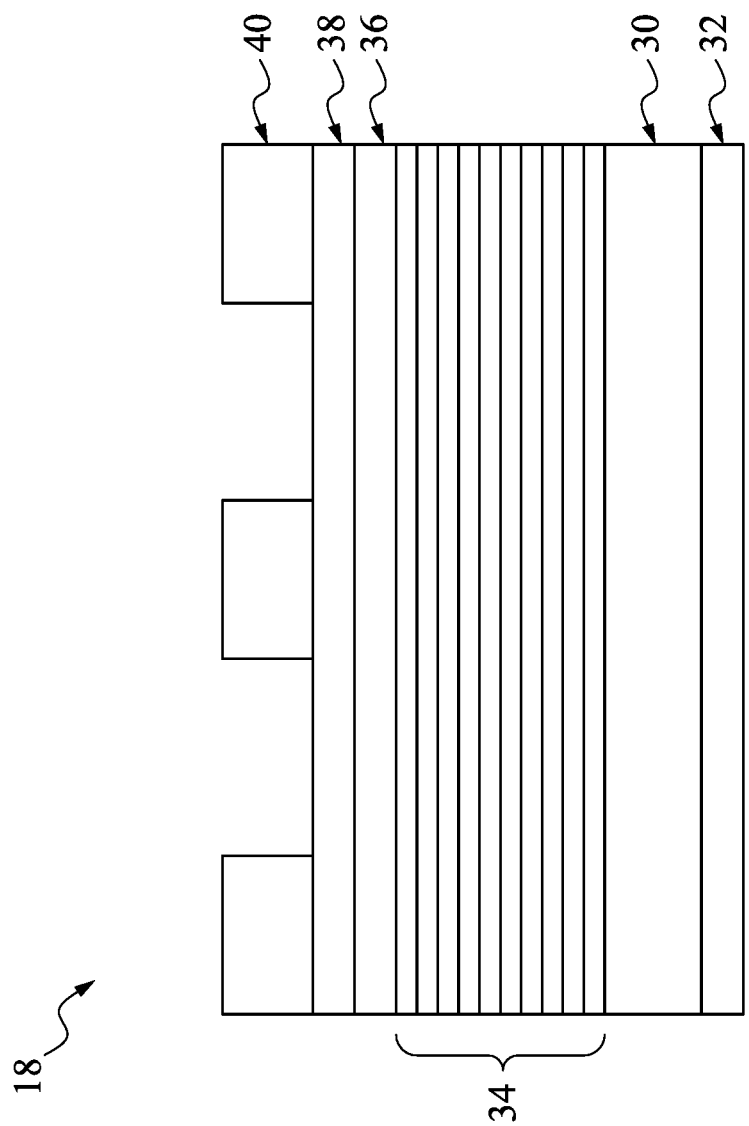
FIG. 2 is a sectional view of a EUV mask constructed in accordance with some embodiments of the present disclosure.

One embodiment of the mask 18 is shown in FIG. 2. The mask 18 in the illustrated embodiment is an EUV mask, and includes a substrate 30 made of a low thermal expansion material (LTEM). The LTEM may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN), though other suitable compositions are possible.

The EUV mask 18 includes a reflective multilayer (ML) structure 34 disposed over the LTEM substrate 30. The ML structure 34 may be selected such that it provides a high reflectivity to a selected radiation type/wavelength. The ML structure 34 includes a plurality of film pairs, such as Mo/Si film pairs a layer of molybdenum above or below a layer of silicon in each film pair). Alternatively, the ML structure 34 may include Mo/Be film pairs, or any materials with refractive index difference being highly reflective at EUV wavelengths.

Still referring to FIG. 2, the EUV mask 18 also includes a capping layer 36 disposed over the ML structure 34 to prevent oxidation of the ML. In one embodiment, the capping layer 36 includes silicon with a thickness ranging from about 4 nm to about 7 nm. The EUV mask 18 may further include a buffer layer 38 disposed above the capping layer 36 to serve as an etching-stop layer in a patterning or repairing process of an absorption layer. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various embodiments.

The EUV mask 18 also includes an absorber layer 40 (also referred to as an absorption layer) formed over the buffer layer 38. In some embodiments, the absorber layer 40 absorbs the EUV radiation directed onto the mask 18. In various embodiments, the absorber layer may be made of tantalum boron nitride (TaBN), tantalum boron oxide (TaBO), or chromium (Cr), radium (Ra), or a suitable oxide or nitride (or alloy) of one or more of the following materials: actinium, radium, tellurium, zinc, copper, and aluminum.

Figure 3:
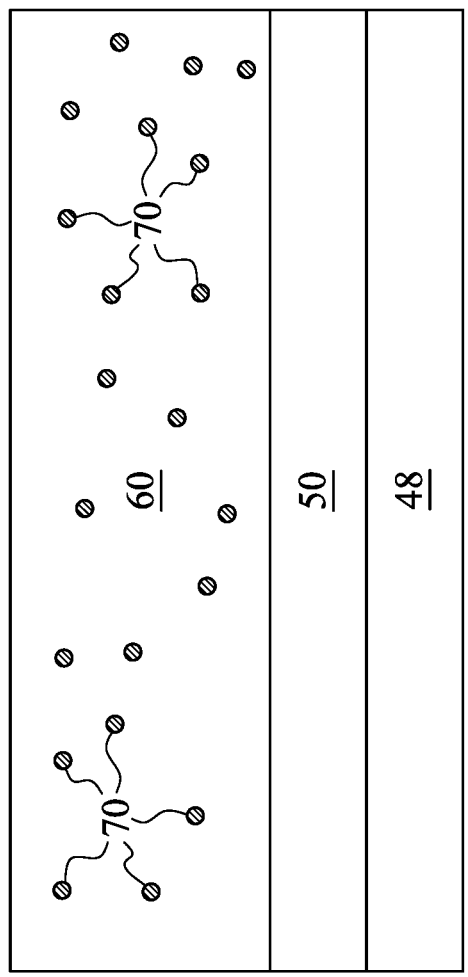
FIG. 3 is a diagrammatic cross-sectional side view of a semiconductor wafer in accordance with some embodiments of the present disclosure.

FIG. 3 is a diagrammatic partial cross-sectional side view of a semiconductor wafer structure 45 in accordance with various embodiments of the present disclosure. The semiconductor wafer structure 45 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Referring to FIG. 3, a semiconductor wafer structure 45 includes a substrate 48. In some embodiments, the substrate 48 is a silicon substrate doped with a p-type dopant such as boron (for example a p-type substrate). Alternatively, the substrate 48 could be another suitable semiconductor material. For example, the substrate 48 may be a silicon substrate that is doped with an n-type dopant such as phosphorous or arsenic (an n-type substrate). The substrate 48 could include other elementary semiconductors such as germanium and diamond. In some embodiments, the substrate 48 includes a compound semiconductor and/or an alloy semiconductor. Further, the substrate 48 could include an epitaxial layer (epi layer), may be strained for performance enhancement, and may include a silicon-on-insulator (SOI) structure.

In some embodiments, the substrate 48 is substantially conductive or semi-conductive. In some embodiments, the substrate is a semiconductor wafer. The electrical resistance may be less than about $10^3$ ohm-meter. In some embodiments, the substrate 48 includes a single crystalline semiconductor layer on at least it surface portion. The substrate 48 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 48 is a silicon layer of an SOI (silicon-on insulator) substrate. In certain embodiments, the substrate 48 is made of crystalline Si.

The substrate 48 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 48. The germanium concentration of the SiGe buffer layers may increase from 30 atomic % for the bottom-most buffer layer to 70 atomic % for the top-most buffer layer.

In some embodiments, the substrate 48 includes at least one metal, metal alloy, and metal/nitride/sulfide/oxide/silicide having the formula MXa, where M is a metal and X is N, S, Se, O, Si, and a is from about 0.4 to about 2.5. In some embodiments, the substrate 48 includes titanium, aluminum, cobalt, ruthenium, titanium nitride, tungsten nitride, tantalum nitride In some other embodiments, the substrate 48 contains a dielectric material with a dielectric constant in a range from about 1 to about 40. In some other embodiments, the substrate 48 contains Si, metal oxide, or metal nitride, where the formula is MXb, wherein M is a metal or Si, and X is N or O, and wherein "b" is in a range from about 0.4 to 2.5. For example, the substrate 48 may contain $SiO_2$, silicon nitride, aluminum oxide, hafnium oxide, or lanthanum oxide.

A material layer 50 is formed over the substrate 48. The material layer 50 can be patterned via a lithography process and, as such, may also be referred to as a patternable layer. In an embodiment, the material layer 50 includes a dielectric material, such as silicon oxide or silicon nitride. In another embodiment, the material layer 50 includes metal. In yet another embodiment, the material layer 50 includes a semiconductor material.

In some embodiments, the material layer 50 has different optical properties than photoresist. For example, the material layer 50 has a different n (index of refraction), k (extinction coefficient), or T (thickness) value than a photoresist. In some embodiments, the material layer 50 comprises at least one of a different polymer structure, acid labile molecule, PAG (photo acid generator), quencher, chromophore, cross linker, or solvent, which leads to different n value to photoresist. In some embodiments, the material layer 50 and the photoresist have different etching resistance. In some embodiments, the material layer 50 contains an etching resistant molecule. The molecule includes a low Onishi number structure, double bond, triple bond, silicon, silicon nitride, Ti, TiN, Al, aluminum oxide, SiON, or combinations thereof.

It is understood that the substrate 48 and the material layer 50 each include additional suitable material compositions in other embodiments.

A photoresist layer 60 is formed over the material layer 50. The photoresist layer 60 is a photosensitive layer that is patterned by exposure to actinic radiation. Typically, the chemical properties of the photoresist regions struck by incident radiation change in a manner that depends on the type of photoresist used. Photoresist layers 60 are either positive tone resists or negative tone resists. A positive tone resist refers to a photoresist material that when exposed to radiation (typically UV light) becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

Whether a resist is a positive tone or negative tone may depend on the type of developer used to develop the resist. For example, some positive photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development. In some embodiments of the present disclosure, a negative tone photoresist is exposed to actinic radiation. The exposed portions of the negative photoresist undergo crosslinking as a result of the exposure to actinic radiation, and during development the exposed, crosslinked portions of the photoresist are removed by the developer leaving the unexposed regions of the photoresist remaining on the substrate.

Photoresists according to the present disclosure include a polymer resin along with one or more photoactive compounds (PACs) in a solvent, in some embodiments. In some embodiments, the polymer resin includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy) ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

The group which will decompose, otherwise known as a leaving group or, in some embodiments in which the PAC is a photoacid generator, an acid labile group, is attached to the hydrocarbon structure so that, it will react with the acids/bases/free radicals generated by the PACs during exposure. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl) methylene group, an (alkylsulfonyl)(alkyl-carbonyl)imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

In some embodiments, the polymer resin also includes other groups attached to the hydrocarbon structure that help to improve a variety of properties of the polymerizable resin. For example, inclusion of a lactone group to the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer resin includes groups that can assist in increasing the adhesiveness of the photoresist layer 60 to underlying structures (e.g., substrate 48). Polar groups may be used to help increase the adhesiveness. Suitable polar groups include hydroxyl groups, cyano groups, or the like, although any suitable polar group may, alternatively, be used.

Optionally, the polymer resin includes one or more alicyclic hydrocarbon structures that do not also contain a group which will decompose in some embodiments. In some embodiments, the hydrocarbon structure that does not contain a group which will decompose includes structures such as 1-adamantyl(meth)acrylate, tricyclodecanyl (meth)acrylate, cyclohexyl (methacrylate), combinations of these, or the like.

Additionally, some embodiments of the photoresist include one or more photoactive compounds (PACs). The PACs are photoactive components, such as photoacid generators, photobase generators, free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyaminesulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis (dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p- methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

In some embodiments in which the PACs are photobase generators, the PACs includes quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl)cyclic amines, combinations of these, or the like.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

In some embodiments, a cross-linking agent is added to the photoresist. The cross-linking agent reacts with one group from one of the hydrocarbon structures in the polymer resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

In some embodiments the cross-linking agent has the following structure:

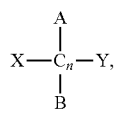

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C.

Specific examples of materials that may be used as the cross-linking agent include the following:

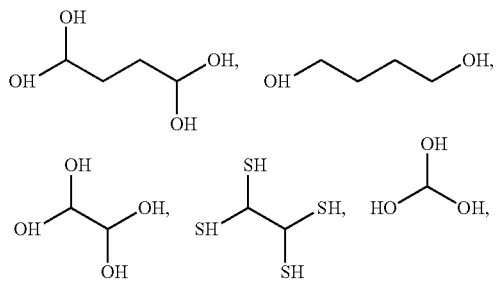

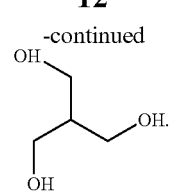

Alternatively, instead of or in addition to the cross-linking agent being added to the photoresist composition, a coupling reagent is added in some embodiments, in which the coupling reagent is added in addition to the cross-linking agent. The coupling reagent assists the cross-linking reaction by reacting with the groups on the hydrocarbon structure in the polymer resin before the cross-linking reagent, allowing for a reduction in the reaction energy of the cross-linking reaction and an increase in the rate of reaction. The bonded coupling reagent then reacts with the cross-linking agent, thereby coupling the cross-linking agent to the polymer resin.

Alternatively, in some embodiments in which the coupling reagent is added to the photoresist without the cross-linking agent, the coupling reagent is used to couple one group from one of the hydrocarbon structures in the polymer resin to a second group from a separate one of the hydrocarbon structures in order to cross-link and bond the two polymers together. However, in such an embodiment the coupling reagent, unlike the cross-linking agent, does not remain as part of the polymer, and only assists in bonding one hydrocarbon structure directly to another hydrocarbon structure.

In some embodiments, the coupling reagent has the following structure:

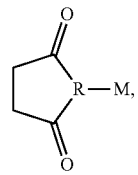

where R is a carbon atom, a nitrogen atom, a sulfur atom, or an oxygen atom; M includes a chlorine atom, a bromine atom, an iodine atom, —NO₂; —SO₃—; —H—; —CN; —NCO, —OCN; —CO₂—; —OH; —OR*, —OC(O)CR*; —SR, —SO₂N(R*)₂; —SO₂R*; SOR; —OC(O)R*; —C(O)OR*; —C(O)R*; —Si(OR*)₃; —Si(R*)₃; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

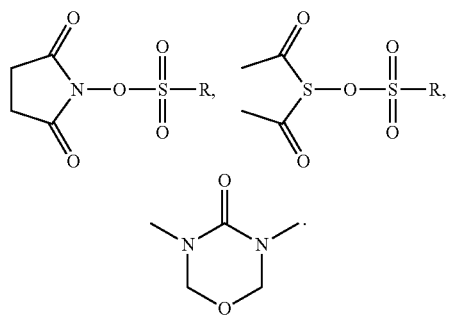

The individual components of the photoresist are placed into a solvent in order to aid in the mixing and dispensing of the photoresist. To aid in the mixing and dispensing of the photoresist, the solvent is chosen at least in part based upon the materials chosen for the polymer resin as well as the PACs. In some embodiments, the solvent is chosen such that the polymer resin and the PACs can be evenly dissolved into the solvent and dispensed upon the layer to be patterned.

In some embodiments, the solvent is an organic solvent, and includes any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the solvent for the photoresist include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, methyl acetate, ethyl acetate, propyl acetate, butyl acetate, methyl lactate, ethyl lactate, propyl lactate, butyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether acetate, propylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, propylene carbonate, vinylene carbonate, ethylene carbonate, butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylether, monophenylether, dipropylene glycol monoacetate, dioxane, methyl pyruvate, ethyl pyruvate, propyl pyruvate, methyl methoxypropionate, ethyl ethoxypropionate, n-methylpyrrolidone (NMP), 2-methoxyethyl ether (diglyme), ethylene glycol monomethyl ether, propylene glycol monomethyl ether, methyl propionate, ethyl propionate, ethyl ethoxy propionate, methylethyl ketone, cyclohexanone, 2-heptanone, cyclopentanone, cyclohexanone, ethyl 3-ethoxypropionate, propylene glycol methyl ether acetate (PGMEA), methylene cellosolve, 2-ethoxyethanol, N-methylformamide, N,N-dimethylformamide, N-methylformanilide, N-methylacetamide, N,N-dimethylacetamide, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, phenyl cellosolve acetate, or the like.

As one of ordinary skill in the art will recognize, the materials listed and described above as examples of materials that may be used for the solvent component of the photoresist are merely illustrative and are not intended to limit the embodiments. Rather, any suitable material that dissolves the polymer resin and the PACs may be used to help mix and apply the photoresist. All such materials are fully intended to be included within the scope of the embodiments.

Additionally, while individual ones of the above described materials may be used as the solvent for the photoresist, in other embodiments more than one of the above described materials are used. For example, in some embodiments, the solvent includes a combination mixture of two or more of the materials described. All such combinations are fully intended to be included within the scope of the embodiments.

In addition to the polymer resins, the PACs, the solvents, the cross-linking agent, and the coupling reagent, some embodiments of the photoresist also includes a number of other additives that assist the photoresist to obtain high resolution. For example, some embodiments of the photoresist also includes surfactants in order to help improve the ability of the photoresist to coat the surface on which it is applied. In some embodiments, the surfactants include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, and polyoxyethylene sorbitan fatty acid esters.

Specific examples of materials used as surfactants in some embodiments include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol dilaurate, polyethylene glycol, polypropylene glycol, polyoxyethylenestearyl ether, polyoxyethylene cetyl ether, fluorine containing cationic surfactants, fluorine containing nonionic surfactants, fluorine containing anionic surfactants, cationic surfactants and anionic surfactants, polyethylene glycol, polypropylene glycol, polyoxyethylene cetyl ether, combinations thereof, or the like.

Another additive added to some embodiments of the photoresist is a quencher, which inhibits diffusion of the generated acids/bases/free radicals within the photoresist. The quencher improves the resist pattern configuration as well as the stability of the photoresist over time. In an embodiment, the quencher is an amine, such as a second lower aliphatic amine, a tertiary lower aliphatic amine, or the like. Specific examples of amines include trimethylamine, diethylamine, triethylamine, di-n-propylamine, tri-n-propylamine, tripentylamine, diethanolamine, and triethanolamine, alkanolamine, combinations thereof, or the like.

In some embodiments, an organic acid is used as the quencher. Specific embodiments of organic acids include malonic acid, citric acid, malic acid, succinic acid, benzoic acid, salicylic acid; phosphorous oxo acid and its derivatives, such as phosphoric acid and derivatives thereof such as its esters, phosphoric acid di-n-butyl ester and phosphoric acid diphenyl ester; phosphonic acid and derivatives thereof such as its ester, such as phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phenylphosphinic acid.

Another additive added to some embodiments of the photoresist is a stabilizer, which assists in preventing undesired diffusion of the acids generated during exposure of the photoresist. In some embodiments, the stabilizer includes nitrogenous compounds, including aliphatic primary, secondary, and tertiary amines; cyclic amines, including piperidines, pyrrolidines, morpholines; aromatic heterocycles, including pyridines, pyrimidines, purines; imines, including diazabicycloundecene, guanidines, imides, amides, or the like. Alternatively, ammonium salts are also be used for the stabilizer in some embodiments, including ammonium, primary, secondary, tertiary, and quaternary alkyl- and arylammonium salts of alkoxides, including hydroxide, phenolates, carboxylates, aryl and alkyl sulfonates, sulfonamides, or the like. Other cationic nitrogenous compounds, including pyridinium salts and salts of other heterocyclic nitrogenous compounds with anions, such as alkoxides, including hydroxide, phenolates, carboxylates, aryl and alkyl sulfonates, sulfonamides, or the like, are used in some embodiments.

Another additive in some embodiments of the photoresist is a dissolution inhibitor to help control dissolution of the photoresist during development. In an embodiment bile-salt esters may be utilized as the dissolution inhibitor. Specific examples of dissolution inhibitors in some embodiments include cholic acid, deoxycholic acid, lithocholic acid, t-butyl deoxycholate, t-butyl lithocholate, and t-butyl-3-acetyl lithocholate.

Another additive in some embodiments of the photoresist is a plasticizer. Plasticizers may be used to reduce delamination and cracking between the photoresist and underlying layers (e.g., the layer to be patterned). Plasticizers include monomeric, oligomeric, and polymeric plasticizers, such as oligo- and polyethyleneglycol ethers, cycloaliphatic esters, and non-acid reactive steroidaly-derived materials. Specific examples of materials used for the plasticizer in some embodiments include dioctyl phthalate, didodecyl phthalate, triethylene glycol dicaprylate, dimethyl glycol phthalate, tricresyl phosphate, dioctyl adipate, dibutyl sebacate, triacetyl glycerine, or the like.

A coloring agent is another additive included in some embodiments of the photoresist. The coloring agent observers examine the photoresist and find any defects that may need to be remedied prior to further processing. In some embodiments, the coloring agent is a triarylmethane dye or a fine particle organic pigment. Specific examples of materials in some embodiments include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045), rhodamine 6G (C. I. 45160), benzophenone compounds, such as 2,4-dihydroxybenzophenone and 2,2', 4,4'-tetrahydroxybenzophenone; salicylic acid compounds, such as phenyl salicylate and 4-t-butylphenyl salicylate; phenylacrylate compounds, such as ethyl-2-cyano-3,3-diphenylacrylate, and 2'-ethylhexyl-2-cyano-3,3-diphenylacrylate; benzotriazole compounds, such as 2-(2-hydroxy-5-methylphenyl)-2H-benzotriazole, and 2-(3-t-butyl-2-hydroxy-5-methylphenyl)-5-chloro-2H-benzotriazole; coumarin compounds, such as 4-methyl-7-diethylamino-1-benzopyran-2-one; thioxanthone compounds, such as diethylthioxanthone; stilbene compounds, naphthalic acid compounds, azo dyes, phthalocyanine blue, phthalocyanine green, iodine green, Victoria blue, crystal violet, titanium oxide, naphthalene black, Photopia methyl violet, bromphenol blue and bromcresol green; laser dyes, such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives are added to some embodiments of the photoresist to promote adhesion between the photoresist and an underlying layer upon which the photoresist has been applied (e.g., the layer to be patterned). In some embodiments, the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, an organophosphorus compound, 8-oxyquinoline, 4-hydroxypteridine and derivatives, 1,10-phenanthroline and derivatives, 2,2'-bipyridine and derivatives, benzotriazoles, organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations thereof, or the like.

The photoresist layer 60 may be formed by a spin-coating process. In a subsequent photolithography process, photons induce decomposition of the PAG. As a result, a small amount of acid is formed, which further induces a cascade of chemical transformations in the photoresist layer 60.

In some embodiments, the photoresist layer 60 is a tri-layer photoresist. A tri-layer photoresist includes a bottom layer (also referred to as an under layer), a middle layer, and a top layer (the top layer may also be referred to as a photosensitive layer). In some embodiments, the bottom layer includes a CxHyOz material, the middle layer includes a SiCxHyOz material, and the top layer includes a CxHyOz material. The CxHyOz material of the bottom layer is the same material as the CxHyOz material of the top layer in some embodiments, and are different materials in other embodiments. The top layer also includes a photoactive compound, such as a photoacid generator (PAG). This allows a photolithography process to be performed to pattern the top layer. In some embodiments, the top layer is patterned by a photolithography process, which may include one or more exposure, baking, developing, and rinsing processes (not necessarily performed in this order). The photolithography process patterns the top layer into a photoresist mask, which may have one or more trenches or openings that expose the middle layer therebelow. The middle layer is then etched using the photoresist mask to form a patterned middle layer, and the bottom layer is then etched using the patterned middle layer to form a patterned bottom layer in some embodiments. The patterned bottom layer is then used to pattern the various layers below.

As discussed above, photon absorption has been a problem in EUV lithography if conventional organic photoresist is used. Therefore, the photoresist layer 60 shown in FIG. 3 has metal-containing (or metal-compound-containing) material 70 added therein. In some embodiments, the metal-containing material 70 includes cesium (Cs), barium (Ba), lanthanum (La), indium (In), cerium (Ce), silver (Ag), or tin (Sn), or combinations or compounds thereof. In embodiments where the photoresist layer 60 is a tri-layer photoresist, the metal-containing material 70 is located in any one of the bottom layer, the middle layer, the top layer, or in all of these layers.

In some embodiments, the metal-containing material includes metal oxide nanoparticles. In some embodiments, the photoresist includes one or more metal oxides nanoparticles selected from the group consisting of titanium dioxide, zinc oxide, zirconium dioxide, nickel oxide, cobalt oxide, manganese oxide, copper oxides, iron oxides, strontium titanate, tungsten oxides, vanadium oxides, chromium oxides, tin oxides, hafnium oxide, indium oxide, cadmium oxide, molybdenum oxide, tantalum oxides, niobium oxide, aluminum oxide, and combinations thereof. As used herein, nanoparticles are particles having an average particle size between about 1 nm and about 20 nm. Metal oxide nanoparticle sizes less than about 1 nm are difficult to obtain and use in photoresist compositions. Metal oxide nanoparticles greater than about 20 nm are too large for use in a resist in embodiments of the disclosure. In some embodiments, the metal oxide nanoparticles have an average particle size between about 2 and about 5 nm. In some embodiments, the amount of metal oxide nanoparticles in the photoresist composition ranges from about 1 wt. % to about 15 wt. % based on the weight of the solvent for the photoresist composition. In some embodiments, the amount of nanoparticles in the photoresist composition ranges from about 2 wt. % to about 10 wt. % based on the weight of the solvent for the photoresist composition. Concentrations of the metal oxide nanoparticles less than about 1 wt. % provide a photoresist coating that is too thin. Concentrations of the metal oxide nanoparticles greater than about 15 wt. % will provide a photoresist composition that is too viscous and that will be difficult to provide a photoresist coating of uniform thickness on the substrate.

In some embodiments, the metal oxide nanoparticles are complexed with a ligand. In some embodiments, the ligand is a carboxylic acid or sulfonic acid ligand. For example, in some embodiments, zirconium oxide or hafnium oxide nanoparticles are complexed with methacrylic acid forming hafnium methacrylic acid (HfMAA) or zirconium methacrylic acid (ZrMAA). In some embodiments, the metal oxide nanoparticles are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen. In some embodiments, the ligand concentration is about 10 wt. % to about 40 wt. % based on the weight on the metal oxide nanoparticles. At concentrations of the ligand below about 10 wt. % the concentration of the ligand is insufficient to complex the metal oxide nanoparticles. Concentrations of the ligand above about 40 wt. % do not provide a significant improvement in complexing the metal oxide nanoparticles over concentrations of the ligand at about 40 wt. %.

In some embodiments, the metal oxide/ligand complexes are formed of a cluster including metallic core having a metal with high EUV absorption, such as Cs, Ba, La, Ce, In, Sn, Ag, or Sb combined with oxygen and/or nitrogen to form 1 to 12 metal core-clusters. The metallic core-clusters are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen in some embodiments.

Examples of suitable metal oxide/ligand complexes according to embodiments of the disclosure are:

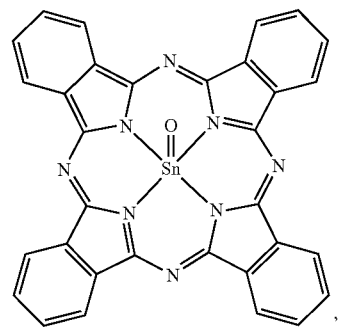

-continued

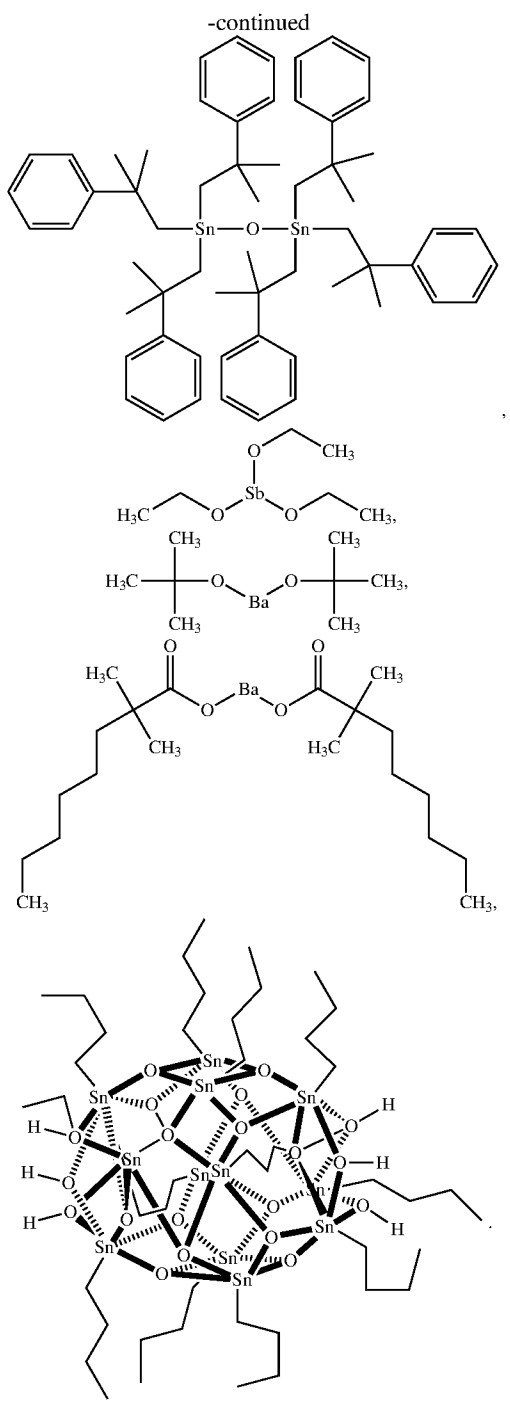

,

In some embodiments, the ligand is HfMAA or ZrMAA dissolved at about a 5 wt. % to about 10 wt. % weight range in a coating solvent, such as propylene glycol methyl ether acetate (PGMEA) based on the total weight of the mixture.

In some embodiments, an acid having an acid dissociation constant, pKa, of −15<pKa<4, or a base having a pKa of 40>pKa>9 is included in the photoresist composition as a ligand stabilizer to stabilize the ligand. The ligand stabilizer inhibits the ligand from separating from the metal/ligand complex. The ligand stabilizer maintains a uniform concentration of metal oxide nanoparticles in the photoresist composition.

The acid dissociation constant, $pK_a$, is the logarithmic constant of the acid dissociation constant $K_a$. $K_a$ is a quantitative measure of the strength of an acid in solution. $K_a$ is the equilibrium constant for the dissociation of a generic acid according to the equation $HA+H_2O \leftrightarrow A^-+H_3O^+$, where HA dissociates into its conjugate base, $A^-$, and a hydrogen ion which combines with a water molecule to form a hydronium ion. The dissociation constant can be expressed as a ratio of the equilibrium concentrations:

$$K_a = \frac{[A^-][H_3O^+]}{[HA][H_2O]}.$$

In most cases, the amount of water is constant and the equation can be simplified to $HA \leftrightarrow A^-+H^+$, and $$K_a = \frac{[A^-][H^+]}{[HA]}.$$

The logarithmic constant, $pK_a$ is related to $K_a$ by the equation $pK_a=-\log_{10}(K_a)$. The lower the value of $pK_a$ the stronger the acid. Conversely, the higher the value of $pK_a$ the stronger the base.

The metal-containing material 70 helps enhance the photon absorption in EUV lithography. However, as discussed above, the metal-containing material 70 may cause contamination problems. Therefore, the present disclosure removes the metal-containing particles after (or during) the EUV lithographic patterning of the photoresist layer 60.

Figure 4:
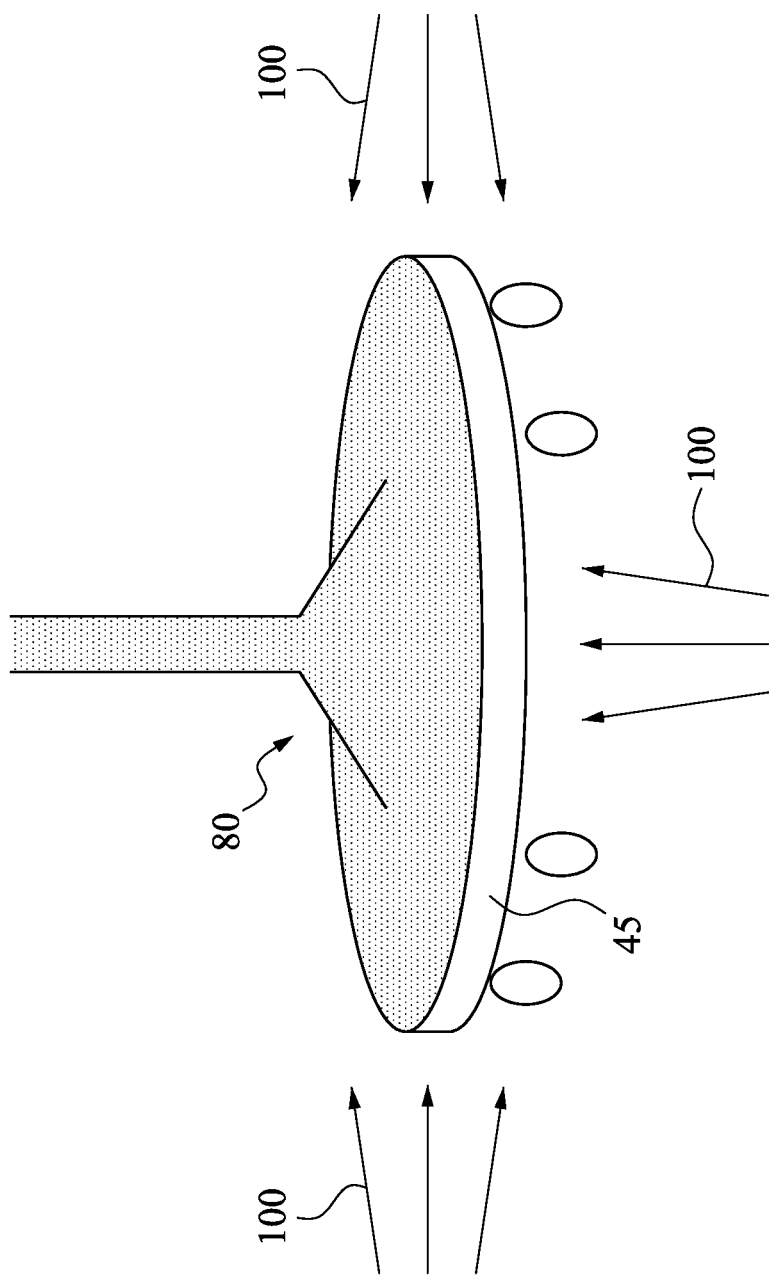
FIG. 4 illustrates one of the various stages in a process flow of cleaning a wafer to remove contaminant according to an embodiment of the present disclosure.

FIG. 4 illustrates one of the various stages in a process flow of cleaning a wafer to remove the contaminant-containing material 70 according to an embodiment of the present disclosure. As is shown in FIG. 4, a material 80 is dispensed on the wafer structure 45. The material 80 may include a photoresist specifically configured for EUV lithography, which as discussed above, includes a metal-containing material such as the metal-containing material 70 shown in FIG. 3. In some embodiments, the material also includes a developer solution that is used to develop a photoresist layer already on the wafer structure.

A cleaning solution 100 is applied to the wafer structure 45 to remove contaminants, such as the metal-containing material 70. The cleaning solution 100 is applied to a back side of the wafer structure 45 and/or the side edges of the wafer structure 45. The wafer structure is cleaned because the wafer transferring process (e.g., as the wafer structure 45 is transferred from one semiconductor fabrication tool to another semiconductor fabrication tool) may involve physical contact with the back side or the side edges of the wafer structure 45. For example, as the wafer structure 45 is transferred out of a semiconductor fabrication tool (an EUV lithography apparatus in an embodiment), various components of the semiconductor fabrication tool may come into contact with the bottom (e.g., back side) or side portions of the wafer structure 45. Through such contact, the metal-containing material 70 (FIG. 3) may be left on the semiconductor fabrication tool. If a subsequent process performed by that semiconductor fabrication tool is supposed to be metal-free, then the metal-containing material 70 may be a contaminant.

Further, if the metal-containing material 70 is not thoroughly cleaned off of the wafer structure 45, the metal-containing material 70 may contaminate a new semiconductor fabrication tool as the wafer is loaded into the new semiconductor fabrication tool. This may be exacerbated by various heating processes, which facilitate the escape of the metal-containing material 70 from the wafer structure 45. The new (and now contaminated) semiconductor fabrication tool may be intended to perform a semiconductor fabrication process in a metal-free environment, in which case the presence of the metal-containing material 70 therein is undesirable. For these reasons, the metal-containing material 70 is cleaned off using the cleaning solution 100. To enhance the effectiveness of the cleaning, the cleaning solution 100 is configured to mostly target the back side and the side edges of the wafer structure 45, although the front side of the wafer structure 45 may be optionally cleaned as well.

The material compositions of the cleaning solution 100 are configured to enhance the removal of the metal-containing material 70 from the wafer structure 45. In some embodiments, the cleaning solution includes two cleaning solutions having different compositions, a first cleaning solution and a second cleaning solution. The first cleaning solution is an aqueous or organic solution including a first solvent. In some embodiments, the cleaning solution 100 includes a first solvent having Hansen solubility parameters of $25 > \delta_d > 13$, $25 > \delta_p > 3$, and $30 > \delta_h > 4$. The units of the Hansen solubility parameters are (Joules/cm$^3$)$^{1/2}$ or, equivalently, MPa$^{1/2}$ and are based on the idea that one molecule is defined as being like another if it bonds to itself in a similar way. $\delta_d$ is the energy from dispersion forces between molecules. $\delta_p$ is the energy from dipolar intermolecular force between the molecules. $\delta_h$ is the energy from hydrogen bonds between molecules. The three parameters, $\delta_d$, $\delta_p$, and $\delta_h$, can be considered as coordinates for a point in three dimensions, known as the Hansen space. The nearer two molecules are in Hansen space, the more likely they are to dissolve into each other.

Solvents having the desired Hansen solubility parameters include propylene glycol methyl ether, propylene glycol ethyl ether, γ-butyrolactone, cyclohexanone, ethyl lactate, dimethyl sulfoxide, acetone, ethylene glycol, methanol, ethanol, propanol, propanediol, n-butanol, water, 4-methyl-2-pentanone, hydrogen peroxide, isopropanol, dimethyl formamide, acetonitrile, acetic acid, toluene, tetrahydrofuran, and butyldiglycol.

The first cleaning solution includes from 0.1 wt. % to 5 wt. % of one or more surfactants based on the total weight of the first cleaning solution. In some embodiments, the surfactant is selected from the group consisting of alkylbenzenesulfonates, lignin sulfonates, fatty alcohol ethoxylates, and alkylphenol ethoxylates. In some embodiments, the surfactant is selected from the group consisting of sodium stearate, 4-(5-dodecyl) benzenesulfonate, ammonium lauryl sulfate, sodium lauryl sulfate, sodium laureth sulfate, sodium myreth sulfate, dioctyl sodium sulfosuccinate, perfluorooctanesulfonate, perfluorobutanesulfonate, alkyl-aryl ether phosphate, alkyl ether phosphates, sodium lauroyl sarcosinate, perfluorononanoate, perfluorooctanoate, octenidine dihydrochloride, cetrimonium bromide, cetylpyridinium chloride, benzalkonium chloride, benzethonium chloride, dimethyldioctadecylammonium chloride, dioctadecyldimethylammonium bromide, 3-[(3-cholamidopropyl)dimethylammonio]-1-propanesulfonate, cocamidopropyl hydroxysultaine, cocamidopropyl betaine, phospholipidsphosphatidylserine, phosphatidylethanolamine, phosphatidylcholine, sphingomyelins, octaethylene glycol monodecyl ether, pentaethylene glycol monodecyl ether, polyethoxylated tallow amine, cocamide monoethanolamine, cocamide diethanolamine, glycerol monostearate, glycerol monolaurate, sorbitan monolaurate, sorbitan monostearate, sorbitan tristearate, and combinations thereof.

Figure 15A:
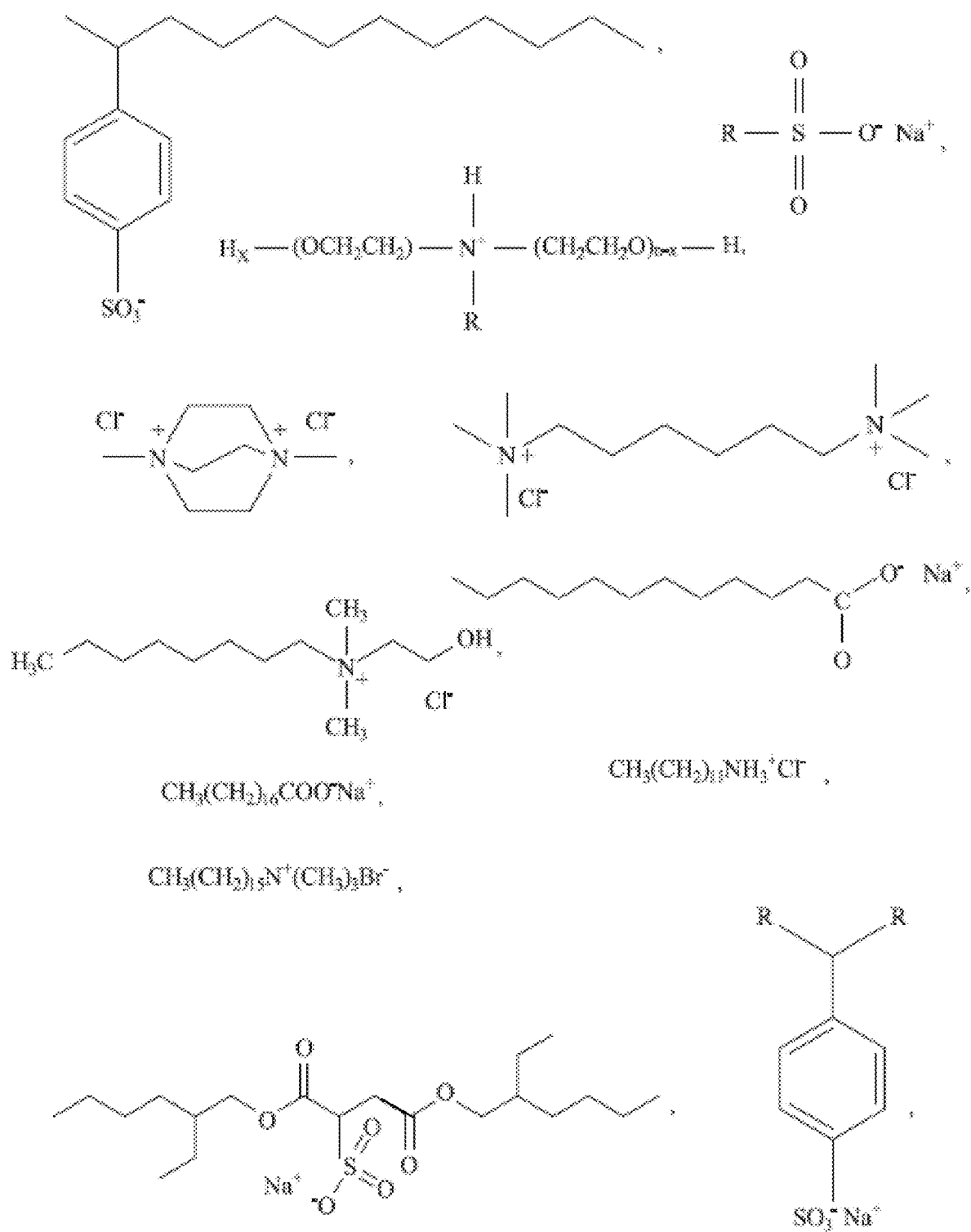
FIGS. 15A and 15B illustrates ionic surfactants in accordance with some embodiments of the present disclosure.
Figure 15B:
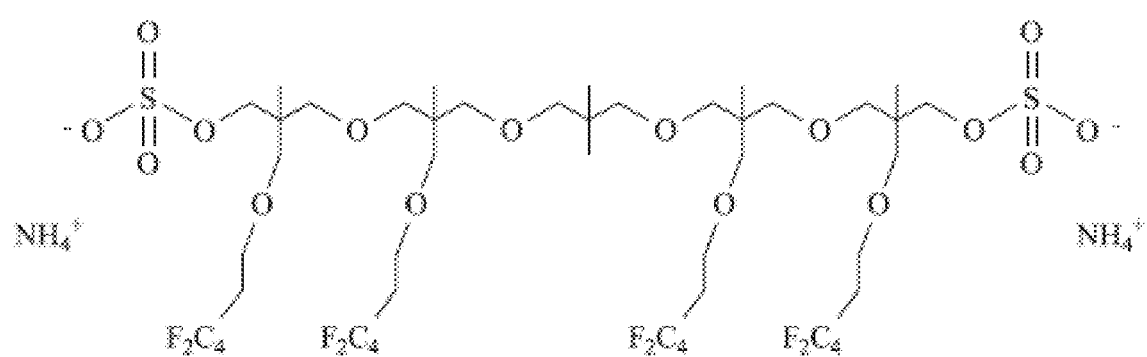

In some embodiments, the surfactant is one or more ionic surfactants, polyethylene oxide and polypropylene oxide, non-ionic surfactants, and combinations thereof. The ionic surfactant is one or more selected from the group consisting of the ionic surfactants shown in FIGS. 15A and 15B wherein R is an substituted or unsubstituted aliphatic, alicyclic aromatic group. In some embodiments, R is a substituted or unsubstituted C1-C12 alkyl, C1-C12 aryl, or C1-C12 aralkyl, or the like.

In some embodiments, the non-ionic surfactant has an A-X or A-X-A-X structure, wherein A is an unsubstituted or substituted with oxygen or halogen, branched or unbranch cyclic or non-cyclic, saturated C2-C100 aliphatic or aromatic group, and X includes one or more polar functional groups selected from the group consisting of —OH, =O, —S—, —P—, —P(O$_2$), —C(=O)SH, —C(=O)OH, —C(=O)OR—, —O—; —N—, —C(=O)NH, —SO$_2$OH, —SO$_2$SH, —SOH, —SO$_2$—, —CO—, —CN—, —SO—, —CON—, —NH—, —SO$_3$NH—, and SO$_2$NH. In some embodiments, the non-ionic surfactant is one or more selected from the group consisting of

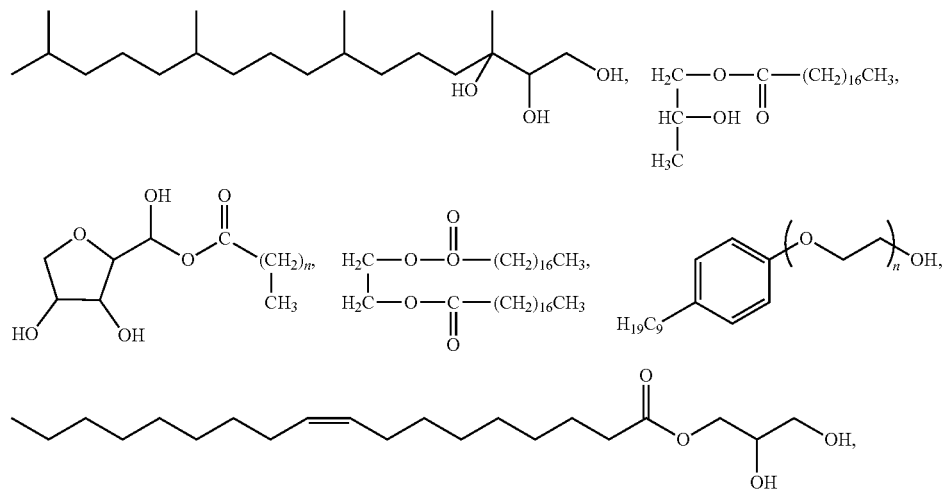

-continued

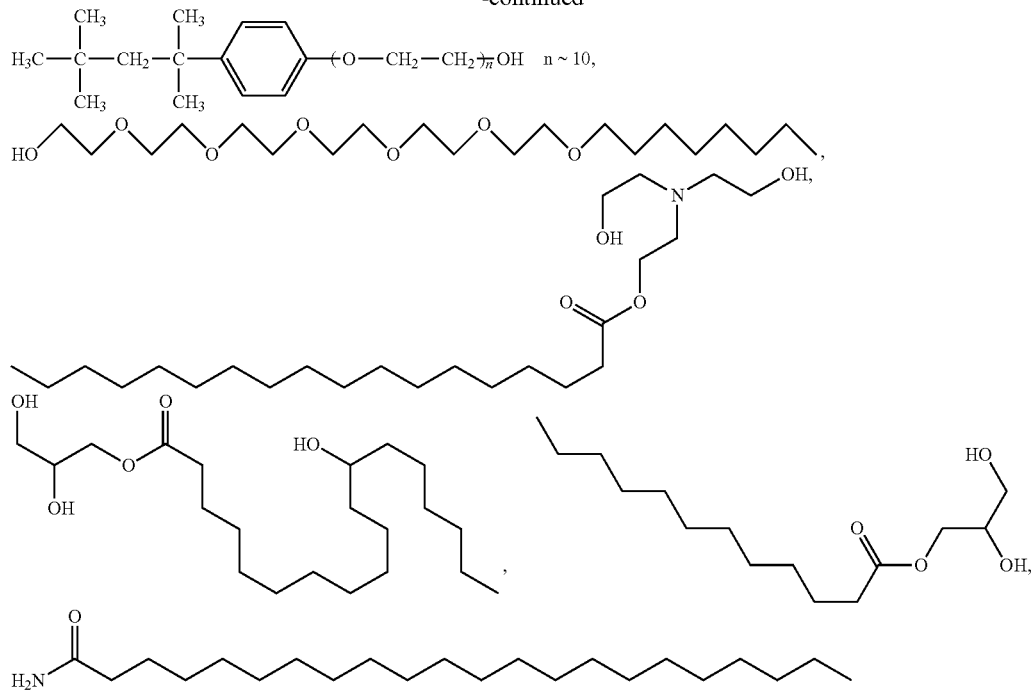

wherein n is the number of repeat units.

In some embodiments, the polyethylene oxide and polypropylene oxide are one or more selected from the group consisting of

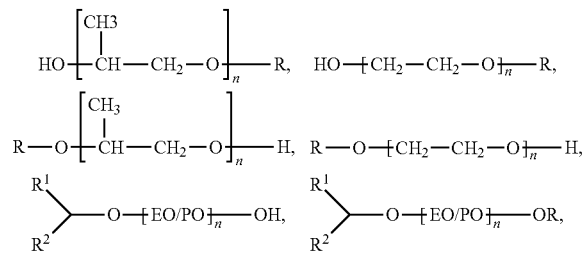

wherein n is the number of repeat units; R, $R^1$, and $R^2$ are same or different, and are substitute or unsubstituted aliphatic, alicyclic, or aromatic groups; and EO/PO is ethylene oxide, propylene oxide, or a copolymer of ethylene oxide and propylene oxide. In some embodiments, R, $R^1$, and $R^2$ are a substituted or unsubstituted C1-C25 alkyl, C1-C25 aryl, or C1-C25 aralkyl, or the like.

In some embodiments, the first cleaning solution includes an acid having an acid dissociation constant, pKa, of −11<pKa<4, or a base having a pKa of 40>pKa>9.5.

In some embodiments, suitable acids for the first cleaning solution include an organic acid selected from the group consisting of ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-o-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, 5-sulfosalicylic acid, trichloroacetic acid, and combinations thereof. In some embodiments, the acid is an inorganic acid selected from the group consisting of nitric acid, sulfuric acid, hydrochloric acid, hydrobromic acid, phosphoric acid, and combinations thereof.

In some embodiments, suitable bases for the first cleaning solution includes an organic base selected from the group consisting of monoethanolamine, monoisopropanolamine, 2-amino-2-methyl-1-propanol, 1H-benzotriazole, 1,2,4-triazole, 1,8-diazabicycloundec-7-ene, tetrabutylammonium hydroxide, tetramethylammonium hydroxide, tetraethylammonium hydroxide, tetrapropylammonium hydroxide, and combinations thereof. In some embodiments, the first cleaning solution includes an inorganic base selected from the group consisting of ammonium hydroxide, ammonium sulfamate, ammonium carbamate, sodium hydroxide, potassium hydroxide, and combinations thereof.

In some embodiments, the concentration of the acid or base ranges from 0.001 wt. % to 30 wt. % based on a total weight of the cleaning solution. In some embodiments, the concentration of the acid or base ranges from 0.1 wt. % to 20 wt. % based on the total weight of the cleaning solution.

In some embodiments, a surface tension of the cleaning solution is less than 40°.

In some embodiments, a concentration of the first solvent is from 60 wt. % to 99 wt. % based on the total weight of the cleaning solution.

In some embodiments, the first cleaning solution includes a chelate, wherein a concentration of the chelate ranges from 0.001 wt. % to 30 wt. % based on the total weight of the cleaning solution.

In some embodiments, the chelate is selected from the group consisting of ethylenediaminetetraacetic acid (EDTA), ethylenediamine-N,N'-disuccinic acid (EDDS), diethylenetriaminepentaacetic acid (DTPA), polyaspartic acid, trans-1,2-cyclohexanediamine-N,N,N',N'-tetraacetic acid monohydrate, ethylenediamine, and combinations thereof, or the like.

According to the various aspects of the present disclosure, the solvent is configured to have specific ranges of Hansen parameters so that the metal-containing material 70 can be easily dissolved and consequently removed.

In some embodiments, a second cleaning solution is applied to the wafer structure. The second cleaning solution has a different composition than the first cleaning solution. In some embodiments, the second cleaning solution includes a solvent having Hansen solubility parameters of $25 > \delta_d > 13$, $25 > \delta_p > 3$, and $30 > \delta_h > 4$. Examples of solvents having these Hansen solubility parameters were previously disclosed herein in reference to the first cleaning solution. In some embodiments, the second cleaning solution does not contain a surfactant. In some embodiments, the second cleaning solution is applied to the wafer structure after the first cleaning solution is applied to the wafer structure. In some embodiments, the second cleaning solution is also applied to the wafer structure before the first cleaning solution is applied to the wafer structure. In some embodiments, both the first cleaning solution and the second cleaning solution are applied to the wafer structure, and in such embodiments, the second cleaning solution is applied last. In some embodiments, the first cleaning solution or the second cleaning solution are applied multiple times to the wafer structure, and in such embodiments, the second cleaning solution is applied last. When the second cleaning solution is applied after the first cleaning solution any residual surfactant from the first cleaning solution is removed by the second cleaning solution. In some embodiments, the second cleaning solution includes water. In some embodiments, the concentration of water ranges from 0.1 wt. % to 20 wt. % based on the total weight of the second cleaning solution.

In some embodiments, a heated cleaning solution is applied to the wafer structure. In some embodiments, the cleaning solution is heated to a temperature ranging between room temperature (e.g., 25° C.) and 75° C. In some embodiments, the cleaning solution is applied to the wafer structure at a temperature ranging between 45 and 75° C.

Figure 5:
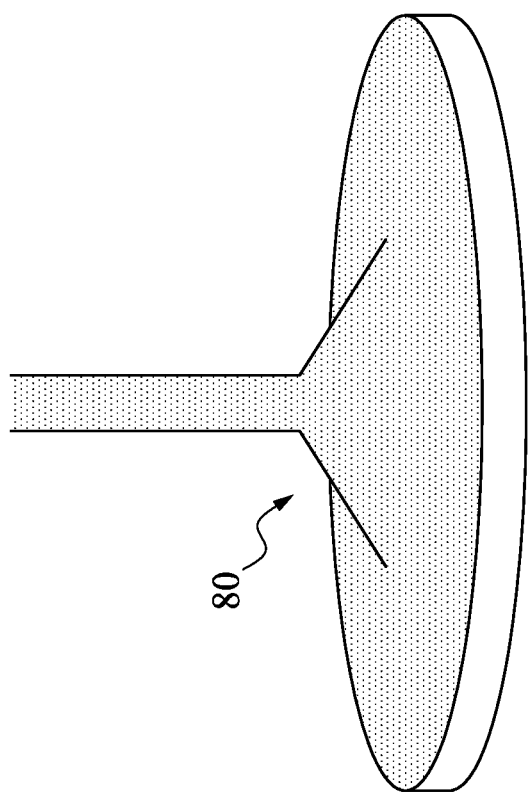
FIG. 5 illustrates one of the various stages in a process flow of cleaning a wafer to remove contaminant according to an embodiment of the present disclosure.
Figure 6:
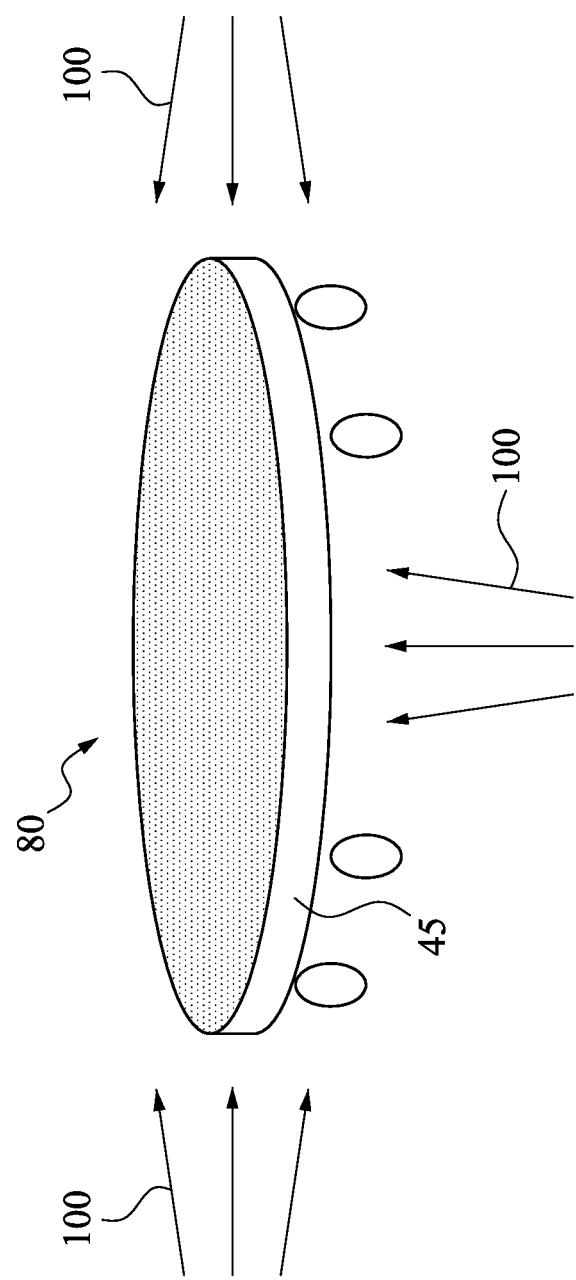
FIG. 6 illustrates one of the various stages in a process flow of cleaning a wafer to remove contaminant according to an embodiment of the present disclosure.

FIGS. 5 and 6 illustrate one of the various stages in a process flow of cleaning a wafer to remove the contaminant (e.g., the metal-containing material 70) according to another embodiment of the present disclosure. For reasons of consistency and clarity, similar components appearing in FIGS. 4-6 are labeled the same. As shown in FIG. 5, the material 80 is dispensed on the wafer structure 45. As discussed above with reference to FIG. 4, the material 80 may include a metal-containing photoresist specifically configured for EUV lithography, and/or it may also include a developer solution. While the material 80 is applied on the wafer structure 45, the cleaning solution 100 is not applied yet.

Referring now to FIG. 6, the cleaning solution 100 is applied to the wafer structure 45 to remove the contaminants, such as metal-containing material 70. The cleaning solution 100 is mostly applied to a back side of the wafer structure 45 and/or the side edges of the wafer structure 45, and is applied to the front side of the wafer structure 45 in some embodiments. As discussed above with reference to FIG. 4, the cleaning solution 100 includes an aqueous or organic solvent having a particular range of Hansen solubility parameters to facilitate the removal of the metal containing material 70. Various additives such as acid, base, or metal chelate are added to the solvent as discussed above, to further enhance the efficacy of the cleaning solution 100 in removing the metal-containing material 70. Thus, whereas the operations corresponding to FIG. 4 are configured to remove the metal-containing material 70 as the metal-containing material 70 is being dispensed (in the photoresist), the operations corresponding to FIGS. 5 and 6 are configured to remove the metal-containing material 70 via an extra cleaning step.

Figure 7:
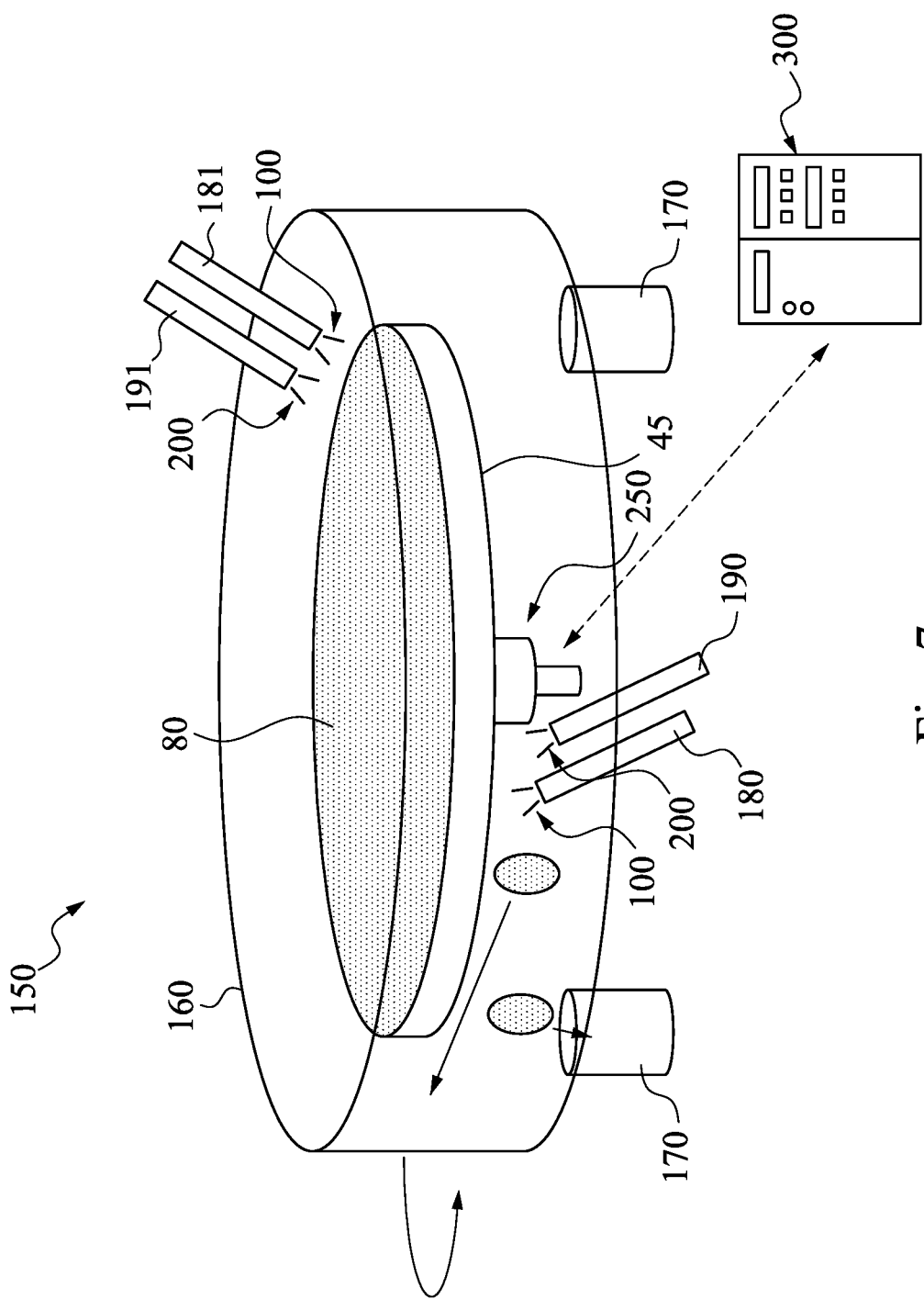
FIG. 7 illustrates an embodiment of a cleaning system for cleaning a wafer to remove contaminant according to embodiments of the present disclosure.

Referring now to FIG. 7, an embodiment of a cleaning system 150 is illustrated. In some embodiments, the cleaning system 150 is a part of an existing semiconductor fabrication apparatus, for example it is integrated into an EUV lithography tool where metal-containing photoresist is used for EUV lithography. In other embodiments, the cleaning system 150 is a part of other types of semiconductor fabrication equipment where metal contaminants are introduced. In the embodiment shown in FIG. 7, the material 80 (e.g., a metal-containing EUV photoresist and/or a developer solution) is dispensed on the front side of the wafer structure 45.

The cleaning system 150 includes a chamber 160 in which the wafer structure 45 is disposed. In some embodiments, the chamber is sealable so as to isolate the wafer structure 45 from other potential contaminants outside the chamber 160. The cleaning system 150 includes one or more exhaust mechanisms 170 in some embodiments that are coupled to the chamber 160 such that fluids (e.g., air, which may include contaminant particles) from inside the chamber 160 are removed from the chamber 160. In other words, a negative pressure is applied to the exhaust mechanisms 170 to create at least a partial vacuum inside or near the exhaust mechanisms 170. The negative pressure applied to the exhaust mechanisms 170 will force the fluids such as air inside the chamber 160 to flow toward, and then out of, the exhaust mechanisms 170.

In some embodiments, the cleaning system 150 further includes a plurality of nozzles 180 and 181 that are each configured to spray the cleaning solution 100, including both the first and second cleaning solutions discussed above with reference to FIGS. 4-6. In more detail, the nozzle 180 is positioned below the wafer structure 45 and is therefore configured to spray the cleaning solution 100 onto the back side of the wafer structure 45. The nozzle 181 is positioned near a side edge of the wafer structure 45 and is therefore configured to spray the cleaning solution 100 onto the side edge of the wafer structure 45.

It is understood that although two nozzles 180, 181 are illustrated herein to spray the cleaning solution 100, in other embodiments, the cleaning system 150 includes other nozzles that are also configured to spray the cleaning solution 100 onto the wafer structure 45. In some embodiments, more than one nozzle are positioned below the wafer structure 45, more than one nozzle are positioned around different side edge points of the wafer structure 45, and one or more nozzles are also be positioned above the wafer structure 45 to spray the cleaning solution 100 onto the front side of the wafer structure 45. In any case, the cleaning solution 100 sprayed by the nozzles 180, 181 (and other similar nozzles) herein will wash the metal-containing material 70 away from the wafer structure 45, for example away from the back surface and the side surfaces of the wafer structure 45. In some embodiments, the first and second cleaning solutions are sprayed from the same nozzles, in other embodiments, the first and second cleaning solutions are sprayed from different nozzles.

To facilitate the removal of the metal-containing material 70 from the wafer structure 45, the cleaning system 150 also includes nozzles 190, 191 that are each configured to deliver a suitable purging fluid 200 (e.g., air) to the wafer structure 45 in some embodiments. In more detail, the nozzle 190 is positioned below the wafer structure 45 and is therefore configured to apply the purging fluid 200 onto the back side of the wafer structure 45. The nozzle 191 is positioned near a side edge (sidewall) of the wafer structure 45 and is therefore configured to spray the purging fluid 200 onto the side edge of the wafer structure 45. Positive pressure is applied through the nozzles 190-191 to ensure that the purging fluid 200 spurts out of the nozzles 190, 191 and makes contact with the wafer structure 45. In some embodiments, a magnitude (or absolute value) of the positive pressure applied through the nozzles 190, 191 exceeds the magnitude (or absolute) value of the negative pressured applied through the nozzles 180-181. In some embodiments, the purging fluid 200 includes clean dry air (CDA). In other embodiments, the purging fluid 200 includes nitrogen, or an inert gas, including helium, neon, and argon.

The interaction between the purging fluid 200 and the wafer enhances the effectiveness of the washing or the removal of contaminant particles, including the removal of the metal-containing material 70. In this manner, the nozzles 190-191 "pushes," and the exhaust mechanisms 170 "pulls" the metal containing-material 70 off of the wafer structure 45 and out of the chamber 160.

In some embodiments, the purging fluid is applied before the first cleaning solution is applied, and in other embodiments, the purging fluid is applied after the first cleaning solution is applied. In other embodiments, the purging fluid is applied after the second cleaning solution is applied.

Although two nozzles 190, 191 are illustrated herein to deliver the purging fluid 200, in some embodiments, the cleaning system 150 includes other nozzles that are also configured to deliver the purging fluid 200 onto the wafer structure 45. In some embodiments, more than one nozzle are positioned below the wafer structure 45, more than one nozzle are positioned around different side edge points of the wafer structure 45, and one or more nozzles are positioned above the wafer structure 45 to deliver the purging fluid 200 onto the front side of the wafer structure 45. In some embodiments, a respective purging fluid nozzle (e.g., nozzles 190, 191) is located adjacent to a respective cleaning solution nozzle 180, 181). The purging fluid 200 delivered by the nozzles 190, 191 (and other similar nozzles) herein will help wash the metal-containing material 70 away from the wafer structure 45, for example away from the back surface and the side surfaces of the wafer structure 45.

In addition to implementing the cleaning solution nozzles 180, 181 and the purging fluid nozzles 190, 191, the cleaning system 150 also includes mechanisms to spin the wafer structure 45 during the cleaning process, such as during the application of the cleaning solution 100 and/or the purging fluid 200. In some embodiments, the cleaning system 150 includes a spinner mechanism 250. The spinner mechanism 250 may include a chuck, a pedestal, and/or a motor. The spinner mechanism is mechanically coupled to the wafer structure 45, and it is configured to rotate or spin in a clockwise and/or a counterclockwise manner in some embodiments. Thus, as the spinner mechanism 250 rotates or spins, so does the wafer structure 45.

To control the spin of the spinner mechanism 250, the cleaning system 150 includes a controller 300 that is communicatively coupled to the spinner mechanism 250 in some embodiments. The controller 300 may be remotely located (or locally located) from the rest of the cleaning system 150. In other words, the controller 300 is implemented outside the chamber 160 in some embodiments, and is implemented inside the chamber 160 in other embodiments. The controller 300 may also be a part of an overall semiconductor manufacturing system, of which the cleaning system 150 is a part. In some embodiments, the controller 300 includes electronic memory and one or more electronic processors configured to execute programming instructions stored in the electronic memory, which includes a program controlling the spin of the spinner mechanism 250. The controller 300, based on the program, controls the spinner mechanism (and therefore the wafer structure 45) to rotate or spin according to a specific spin speed, spin duration, and/or a spin direction (e.g., clockwise or counterclockwise). In some embodiments, the controller 300 is configured to set a spin rate/speed of the wafer in a range between about 800 RPM to about 4500 RPM, for example between about 800 RPM and about 3500 RPM. This range of the spin speed is optimized to enhance the distribution of the cleaning solution 100 on the wafer structure 45 and to facilitate the removal of the contaminant materials such as the metal-containing material 70 in some embodiments.

In some embodiments, the controller 300 is also programmed to control the application of the first and second cleaning solutions. In some embodiments, the controller 300 is programmed to control the switching between the application of the first cleaning solution, second cleaning solution, and the purging fluid. In some embodiments, the controller 300 is programmed to control the duration of the application of the first cleaning solution, second cleaning solution, and the purging fluid. In some embodiments, the application of the first and second cleaning solutions ranges from 1 second to about 60 seconds. In some embodiments, the application of the first and second cleaning solution ranges from about 10 seconds to about 30 seconds. In some embodiments, the final cleaning solution application is of the second cleaning solution. In some embodiments, the duration of the final application of the second cleaning solution is from about 0.5 seconds to about 30 seconds. In some embodiments, the duration of the final application of the second cleaning solution is from about 1 second to about 10 seconds.

The spinning of the wafer structure 45 need not be only in one direction. Instead of performing the spin in just a clockwise direction or just in a counterclockwise direction, the wafer structure 45 (under the control of the controller 300) undergoes a combination of clockwise and counterclockwise spins in some embodiments. The wafer structure 45 is configured to spin in a clockwise direction for an X number of seconds, followed by a spin in the counterclockwise direction for a Y number of seconds (where Y may be the same as X or may be different), or vice versa, in some embodiments. The combination of performing clockwise spins and counterclockwise spins in an alternating manner may further enhance the application of the cleaning solution 100 and the purging fluid 200 with respect to the wafer structure 45, thereby improving the removal of the contaminants.

Figure 8:
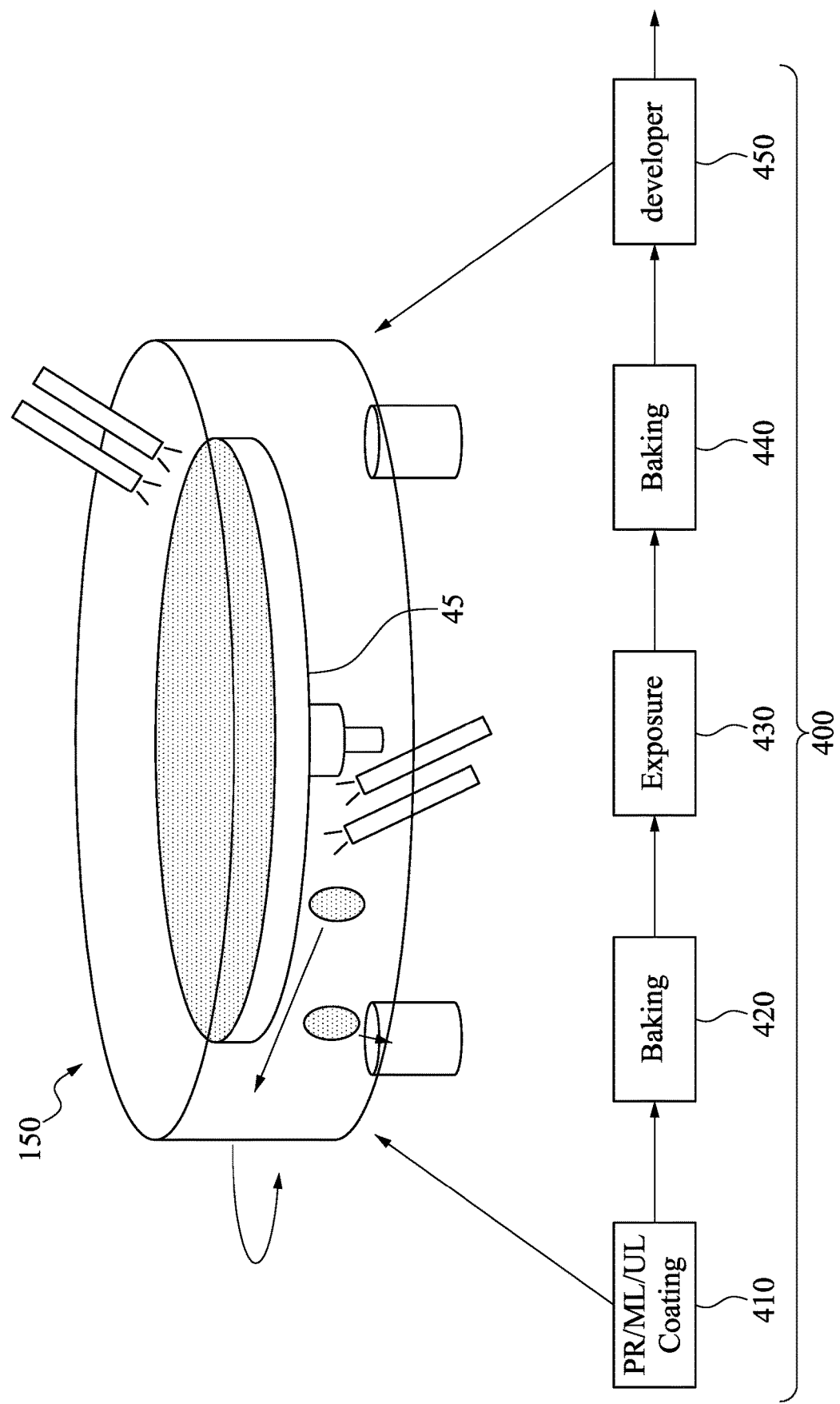
FIG. 8 illustrates a process flow for cleaning a wafer according to an embodiment of the present disclosure.

FIG. 8 illustrates a process flow for cleaning a wafer according to an embodiment of the present disclosure. Referring to FIG. 8, an example lithography process 400 is illustrated. In some embodiments, the lithography process 400 is an EUV lithography process. The lithography process 400 includes a step 410 in which a photosensitive material is coated onto a wafer such as the wafer structure 45. The photosensitive material may include a tri-layer photoresist (including a top layer (PR), a middle layer (ML), and an under layer (UL)). The photosensitive material may be coated via a spin-coating process. As discussed above, to enhance the photon absorption, the photosensitive material contains metal, in some embodiments, and the metal is considered a contaminant after the lithography process is performed and should be removed.

In some embodiments, the cleaning solution is applied simultaneously with the application of photosensitive material (photoresist). In other embodiments, the cleaning solution is applied after the application of the photosensitive material (photoresist).

The lithography process 400 includes an operation 420 of pre-exposure baking, in which the wafer (and the metal-containing photosensitive material coated thereon) is baked. In some embodiments, the pre-exposure baking is performed at a temperature ranging from about 40° C. to about 120° C. for about 10 seconds to about 120 seconds. The lithography process 400 includes an exposure operation 430, in which the wafer (and the metal-containing photosensitive material coated thereon) is selectively exposed to EUV radiation. In some embodiments, the EUV radiation has a wavelength of about 13.5 nm generated by a $CO_2$ laser-excited Sn plasma.

In some embodiments, the exposure radiation includes other actinic radiation, such as g-line (wavelength of about 436 nm), i-line (wavelength of about 365 nm), ultraviolet radiation, far ultraviolet radiation, electron beam, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm).

The lithography process 400 includes an operation 440 of post-exposure baking, in which the wafer structure 45 (and the metal-containing photosensitive material coated thereon) is baked. In some embodiments, the post-exposure baking is performed at a temperature ranging from about 40° C. to about 200° C. for about 10 seconds to about 120 seconds. The lithography process 400 includes an operation 450 of developing, in which the wafer (and the metal-containing photosensitive material coated thereon) is developed via an application of a developer solution onto the wafer. The lithography process 400 may include additional processes that are not specifically illustrated or discussed herein.

According to the process flow in FIG. 8, the wafer structure 45 is cleaned, using the cleaning system 150 discussed above with reference to FIG. 7, while operations 410 and 450 are performed. In other words, as the metal-containing photosensitive material (photoresist) is applied to the wafer structure 45, the wafer structure 45 is cleaned using the cleaning system 150. In addition, as the developer solution is applied to the wafer structure 45 to develop the exposed photosensitive material, the wafer structure 45 is also cleaned using the cleaning system 150. The wafer structure 45, however, need not necessarily be cleaned twice. For example, the wafer structure 45 may be cleaned just during operation 410, or alternatively it may be cleaned just during operation 450, but not necessarily during both operations 410 and 450. In some embodiments, both the first and second cleaning solutions are applied during both operations 410 and 450 or both the first and second cleaning solutions are applied during either of the operations 410 and 450. In some embodiments, the final cleaning solution applied is the second cleaning solution.

Figure 9:
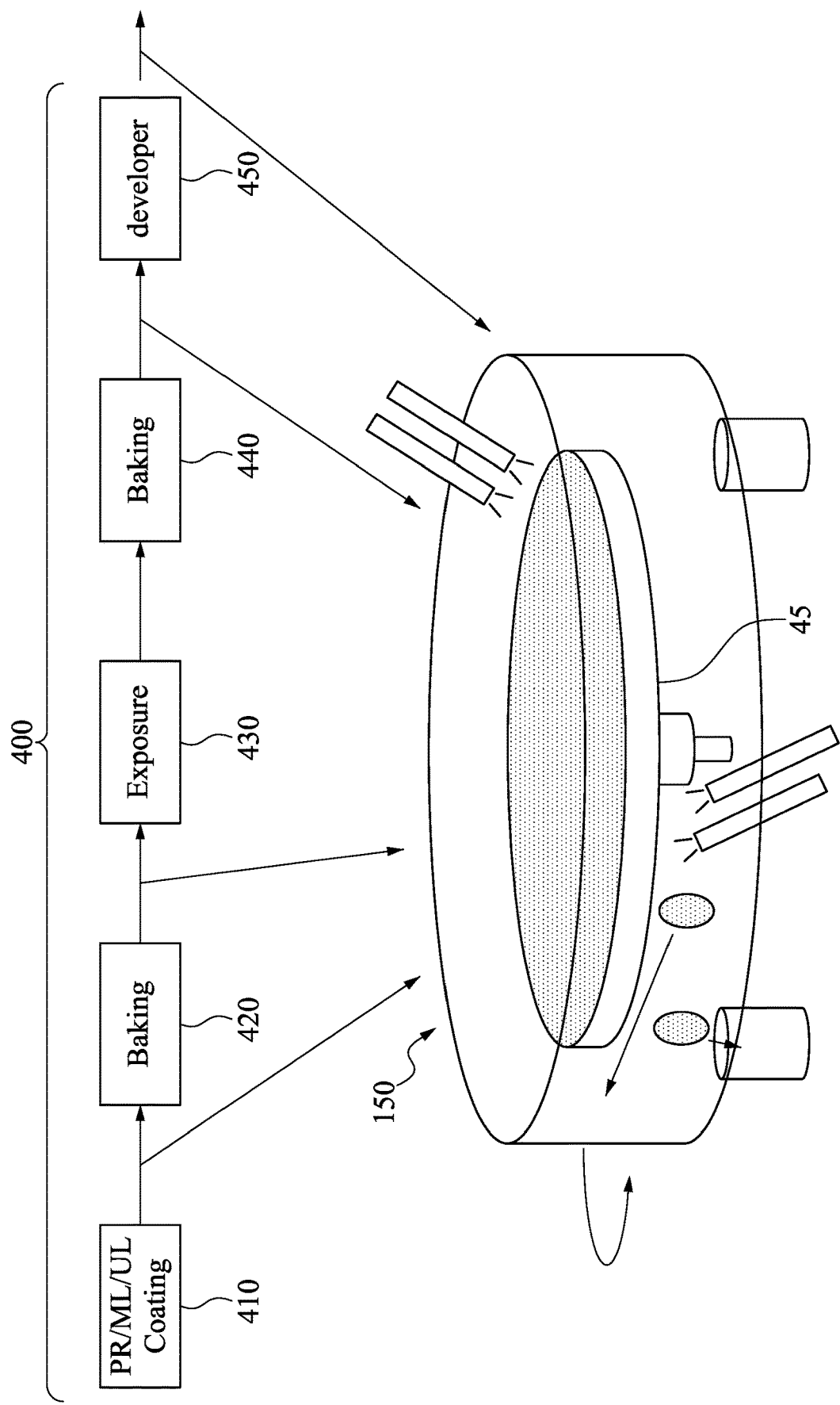
FIG. 9 illustrates a process flow for cleaning a wafer according to an embodiment of the present disclosure.

FIG. 9 illustrates a process flow for cleaning a wafer according to an embodiment of the present disclosure. For reasons of consistency and clarity, similar elements appearing in FIGS. 8 and 9 are labeled the same. In comparison to the process flow shown in FIG. 8, the process flow shown in FIG. 9 performs the wafer cleaning after the operations 410, 420, 440, and 450, rather than during the operations 410 and 450. In other words, the wafer structure 45 may be cleaned (using the cleaning system 150) after the metal-containing photosensitive material has been coated onto the wafer, and/or after the pre-exposure baking operation, and/or after the post-exposure baking operation, and/or after the developing operation. The wafer structure 45 need not necessarily be cleaned four times in this method. For example, the wafer structure 45 may be cleaned (using the cleaning system 150) after any one of the operations 410, 420, 440, and 450, or combinations thereof. In some embodiments, both the first and second cleaning solutions are applied after any of the operations 410, 420, 440, and 450, or after the all of the operations 410, 420, 440, and 450. In some embodiments, the final cleaning solution applied is the second cleaning solution.

It is understood that although the discussions above have focused on cleaning the wafer to remove a metal contaminant arising from a metal-containing EUV photoresist, the systems and method discussed herein is not limited to this particular context. The systems and methods of the present disclosure can also be used in other semiconductor fabrication situations where metal contaminants need to be removed.

Figure 10:
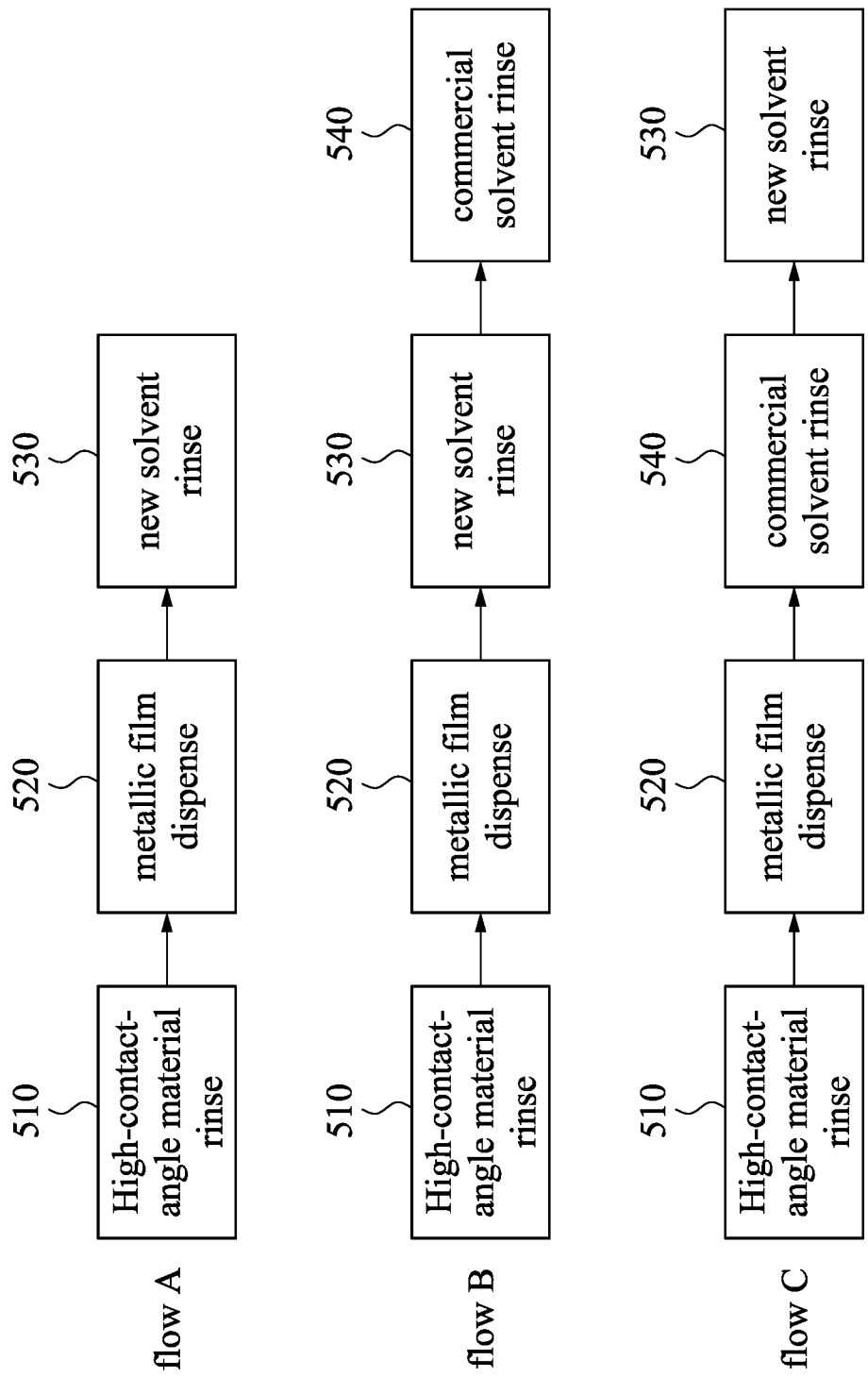
FIG. 10 illustrates various process flows for cleaning a wafer according to embodiments of the present disclosure.

Some embodiments include an additional step of rinsing the wafer with a high-contact-angle material. This is diagrammatically illustrated in FIG. 10, which illustrates several different process flows according to embodiments of the present disclosure. Referring to FIG. 10, process flow A includes an operation 510 of performing a high-contact-angle material rinsing process to the wafer, for example the wafer structure 45 discussed above. The rinse may be applied to a backside or an edge of the wafer. The high-contact-angle material includes a material that has a contact angle that is greater than 75 degrees with respect to water in some embodiments. After the wafer surface is treated with the high-contact-angle material, the wafer surface becomes hydrophobic. Since this is done before the photoresist layer is coated on the wafer surface, it makes the subsequent wafer cleaning easier. In other words, the hydrophobicity of the wafer surface (due to the application of the high-contact-angle material in operation 510) allows the metal-containing material in the photoresist to be more easily washed off of the wafer in some embodiments.

Still referring to FIG. 10, an operation 520 of dispensing a metallic film is performed after the high-contact-angle material rinse of operation 510. The metallic film may be the metal-containing material in the photoresist discussed above. Thus, operation 520 may involve coating a metal-containing photoresist material on the wafer surface.

A new solvent rinsing operation 530 is subsequently performed. The new solvent includes embodiments of the cleaning solution 100 discussed herein, such as solvents with the specified ranges of Hansen parameters. As discussed herein, the cleaning solution 100 includes a first cleaning solution and a second cleaning solution in some embodiments. Operation 530 allows the metal-containing material to be washed off of the wafer, which reduces risks of contamination.

Process flows B and C are similar to flow A. In flows B and C, another operation 540 is performed, in which a commercial solvent rinsing process is performed to the wafer. In some embodiments, the commercial solvent includes other solvents used in photolithographic processing. The difference between flows B and C is that, the operation 540 (commercial solvent rinsing) is performed after the operation 530 in flow B, but it is performed before the operation 530 in flow C. In some embodiments, the commercial solvents include one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

Regardless of the specific process flow, the optional operation 510 of rinsing the wafer with the high-contact-angle material will facilitate the cleaning process discussed above. In some embodiments, the high-contact-angle material includes a carbon fluoride compound, for example a $C_xF_y$ unit. In various embodiments, x is in a range between 1 and 7, and y is saturated by structure. Some examples include: $-CF_3$, $-C_3F_7$, $-C_5F_{11}$, or $-C_6F_{13}$. This carbon fluoride compound may be in the form of an additive that is added to a solvent. In some embodiments, the carbon fluoride compound is a polymer. The carbon fluoride compound is branched in some embodiments, and unbranched in other embodiments. The carbon fluoride compound is cyclic in some embodiments, noncyclic in other embodiments. In some embodiments, the carbon fluoride compound is saturated with hydrogen or halogen atom.

In embodiments where the carbon fluoride compound is a polymer, the polymer chain includes polystyrene, acrylate, or a 1-10 carbon unit to form a polymer. The polymer may include a $C_xF_y$ monomer. In some embodiments, the high-contact-angle material includes hexamethyldisilazane, a N-dimethyltrimethylsilylamine compound, or combinations thereof. For example, the high-contact-angle material may include 1-25% hexamethyldisilazane or N, or a N-dimethyltrimethylsilylamine compound.

Figure 11:
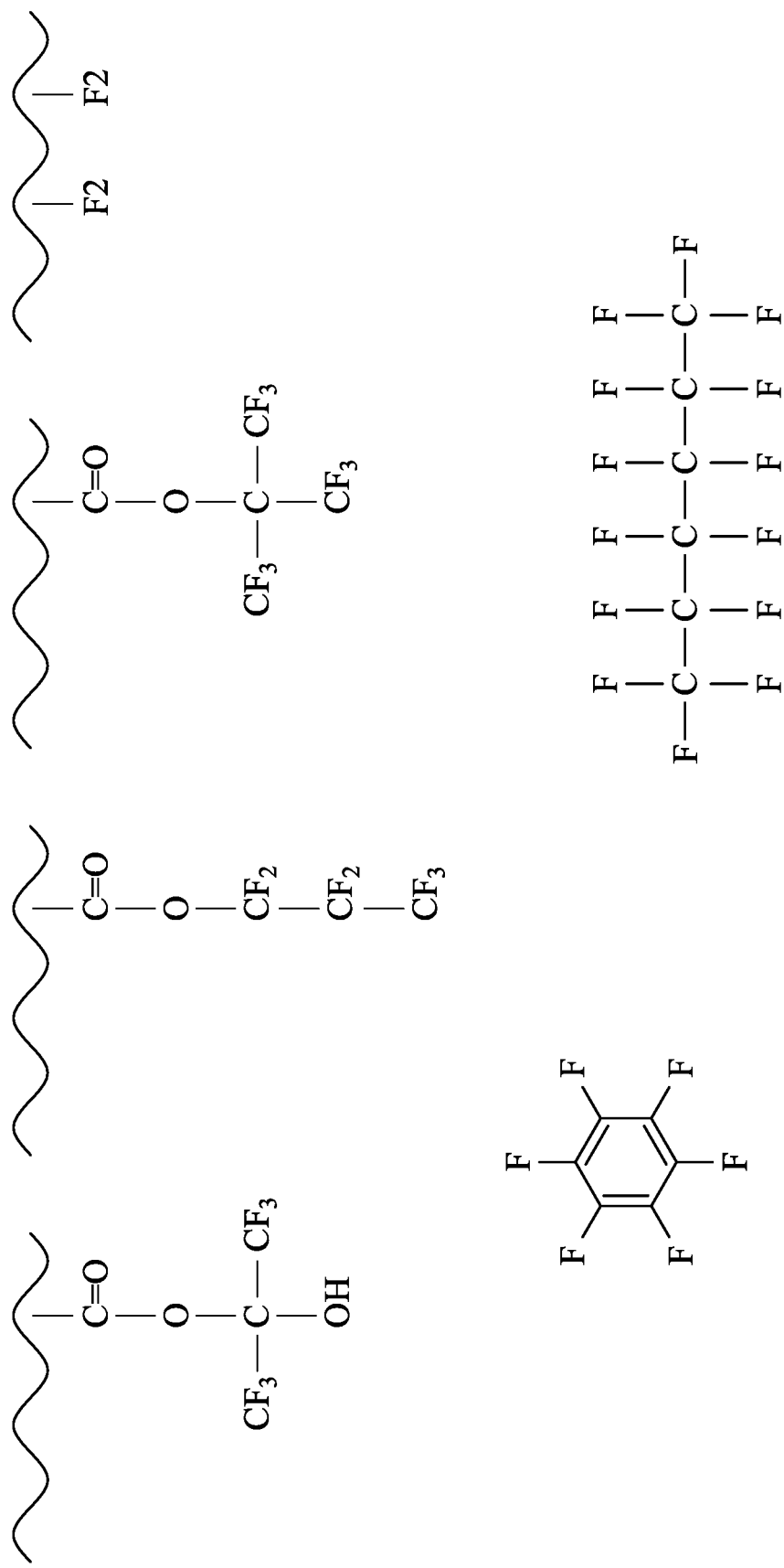
FIG. 11 illustrates exemplary chemical composition formulas for an additive in a solvent according to embodiments of the present disclosure.

FIG. 11 illustrates the chemical formulas of some exemplary carbon fluoride compounds. These chemical formulas are merely examples and are not intended to be limiting. Other suitable carbon fluoride compounds are used in alternative embodiments.

Figure 12:
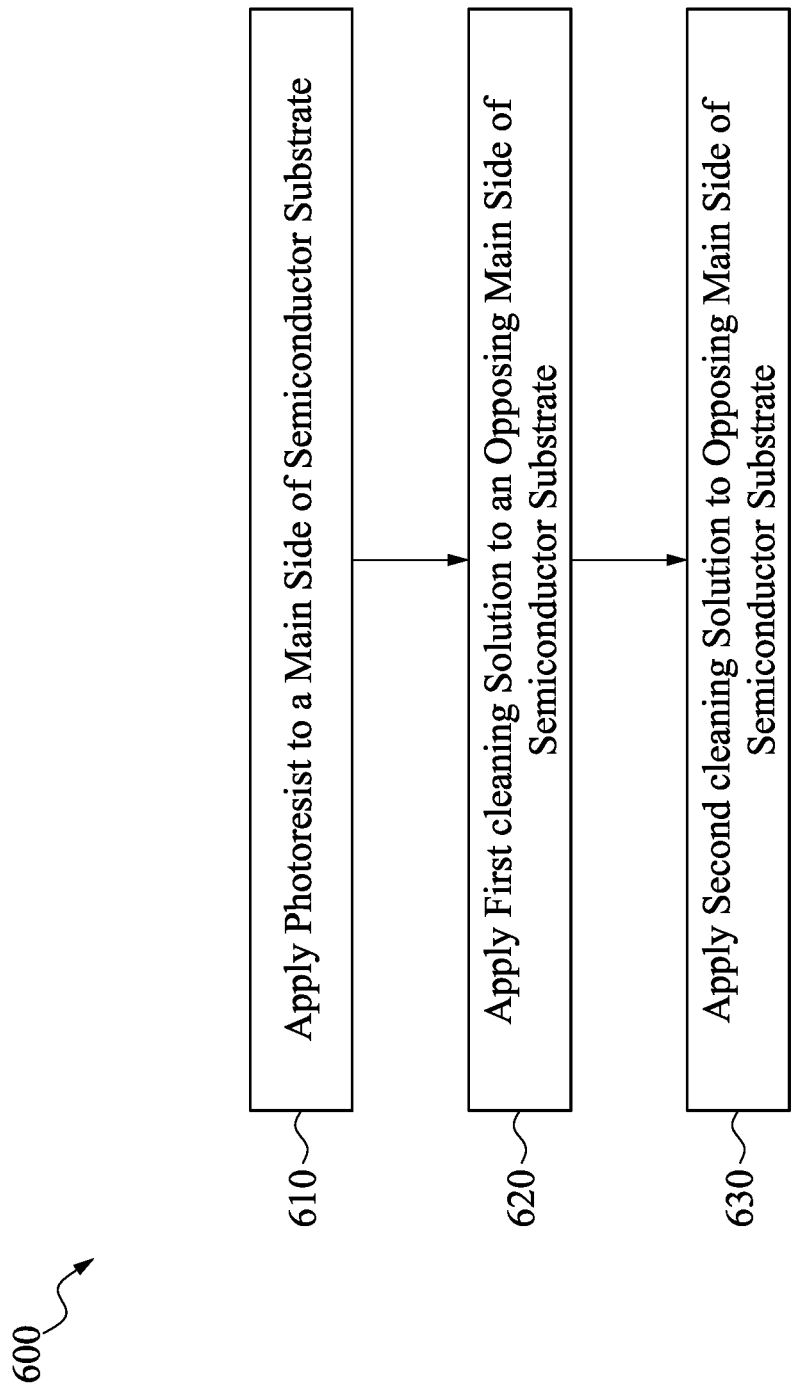
FIG. 12 is a flowchart illustrating a method of cleaning a semiconductor substrate in accordance with some embodiments of the present disclosure.

FIG. 12 is a flowchart of a method 600 of cleaning a semiconductor substrate, including an operation 610 of applying a photoresist 80 to a main side of a semiconductor substrate 45. In operation 620, a first cleaning solution 100 is applied to an opposing main side of the semiconductor substrate 45. Operations 610 and 620 are performed substantially simultaneously in some embodiments. In other embodiments, operation 620 is performed after operation 610.

In some embodiments, the first cleaning solution 100, includes a first solvent having Hansen solubility parameters of $25 > \delta_d > 13$, $25 > \delta_p > 3$, and $30 > \delta_h > 4$; an acid having an acid dissociation constant, pKa, of $-1 < pKa < 4$, or a base having a pKa of $40 > pKa > 9.5$; and a surfactant. In some embodiments, the surfactant is one or more ionic surfactants, polyethylene oxide and polypropylene oxide, non-ionic surfactants, and combinations thereof. In some embodiments, the ionic surfactant is one or more selected from the group consisting of the ionic surfactants shown in FIGS. 15A and 15B wherein R is a substituted or unsubstituted aliphatic, alicyclic, or aromatic group. In some embodiments, R is a substituted or unsubstituted C1-C12 alkyl, C1-C12 aryl, or C1-C12 aralkyl, or the like.

In some embodiments, the non-ionic surfactant has an A-X or A-X-A-X structure, wherein A is a unsubstituted or substituted with oxygen or halogen, branched or unbranched, cyclic or non-cyclic, saturated C2-C100 aliphatic or aromatic group, and X includes one or more polar functional groups selected from the group consisting of $-OH$, $=O$, $-S-$, $-P-$, $-P(O_2)$, $-C(=O)SH$, $-C(=O)OH$, $-C(=O)OR-$, $-O-$; $-N-$, $-C(=O)NH$, $-SO_2OH$, $-SO_2SH$, $-SOH$, $-SO_2-$, $-CO-$, $-CN-$, $-SO-$, $-CON-$, $-NH-$, $-SO_3NH-$, and $SO_2NH$.

In operation 630, a second cleaning solution is applied to the opposing main side of the semiconductor substrate 45. The second cleaning solution has a different composition than the first cleaning solution. The second cleaning solution includes a solvent having Hansen solubility parameters of $25 > \delta_d > 13$, $25 > \delta_p > 3$, and $30 > \delta_h > 4$. In some embodiments, the second cleaning solution includes water, wherein the concentration of the water ranges from 0.1 wt. % to 20 wt. % based on the total weight of the second cleaning solution. In some embodiments, the second cleaning solution does not contain the surfactant.

In some embodiments, the second cleaning solution is applied to the semiconductor substrate after the first cleaning solution is applied to the semiconductor substrate. In some embodiments, the second cleaning solution is also applied to the semiconductor substrate before applying the first cleaning solution to the semiconductor substrate.

In some embodiments, the first and second cleaning solutions are applied to edges of the semiconductor substrate, wherein the edges extend between the first main side and the second main side of the semiconductor substrate.

In some embodiments, a concentration of the surfactant in the first cleaning solution ranges from 0.1 wt. % to 5 wt. % based on a total weight of the first cleaning solution. In some embodiments, a concentration of the acid or base ranges from 0.001 wt. % to 30 wt. % based on a total weight of the first cleaning solution. In some embodiments, the concentration of the acid or base ranges from 0.1 wt. % to 20 wt. % based on the total weight of the first cleaning solution. In some embodiments, a concentration of the first solvent is from 60 wt. % to 99 wt. % based on the total weight of the first cleaning solution. In some embodiments, a surface tension of the first cleaning solution is less than 40°.

In some embodiments, the polyethylene oxide and polypropylene oxide are one or more selected from the group consisting of

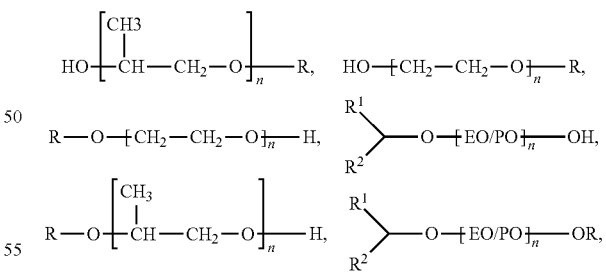

wherein n is the number of repeat units; R, $R^1$, and $R^2$ are same or different, and are substituted or unsubstituted aliphatic, alicyclic, or aromatic groups; and EO/PO is ethylene oxide, propylene oxide, or a copolymer of ethylene oxide and propylene oxide. In some embodiments, R, $R^1$, and $R^2$ are a substituted or unsubstituted C1-C25 alkyl, C1-C25 aryl, or C1-C25 aralkyl, or the like.

In some embodiments, the non-ionic surfactant is one or more selected from the group consisting of

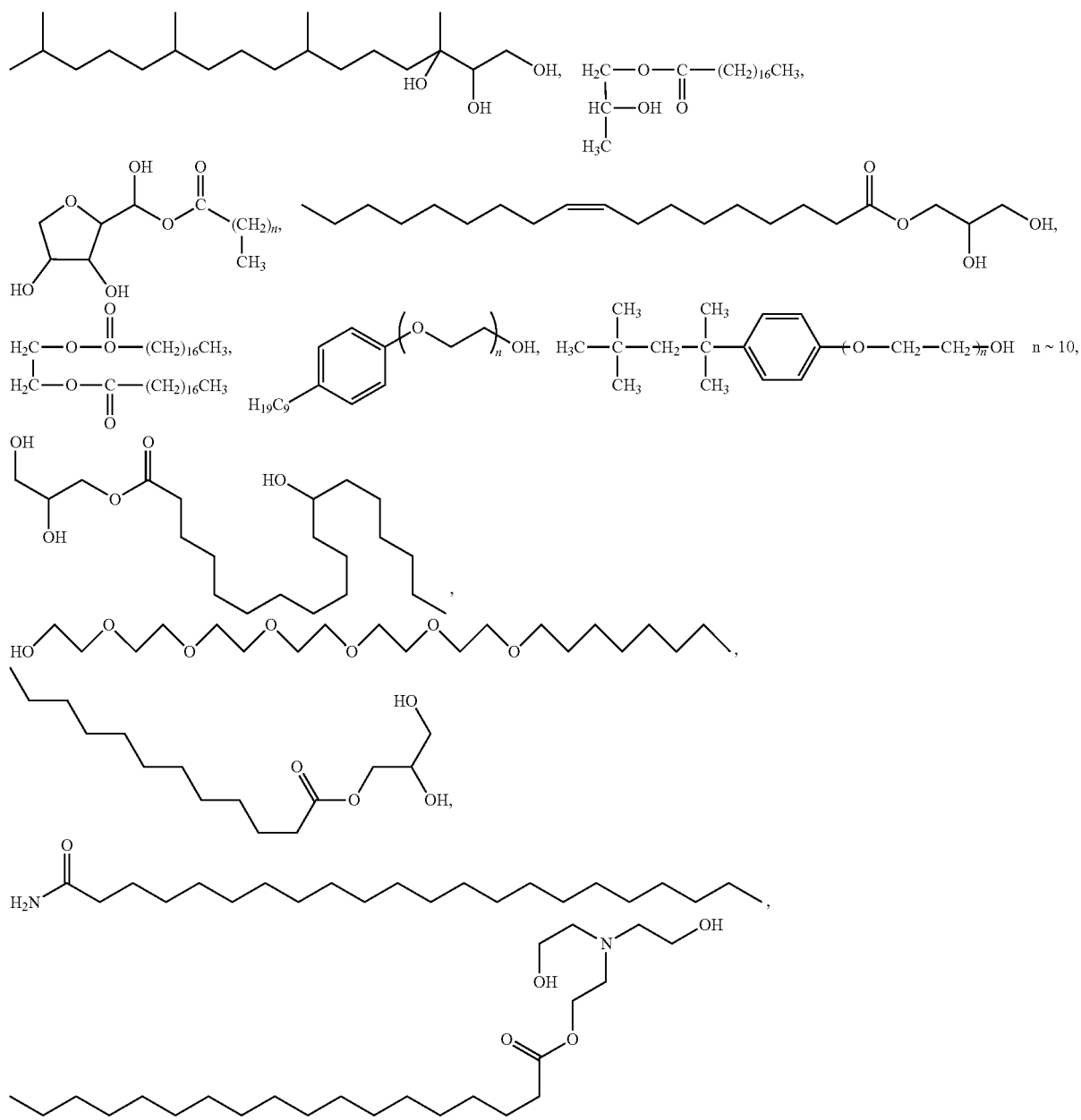

wherein n is the number of repeat units.

In some embodiments, the first cleaning solution further includes a chelate, wherein a concentration of the chelate ranges from 0.001 wt. % to 30 wt. % based on the total weight of the first cleaning solution.

In some embodiments, the photoresist contains a metal.

In some embodiments, the acid or base is an aqueous acid or aqueous base. In other embodiments, the acid or base is an organic acid or organic base.

Figure 13:
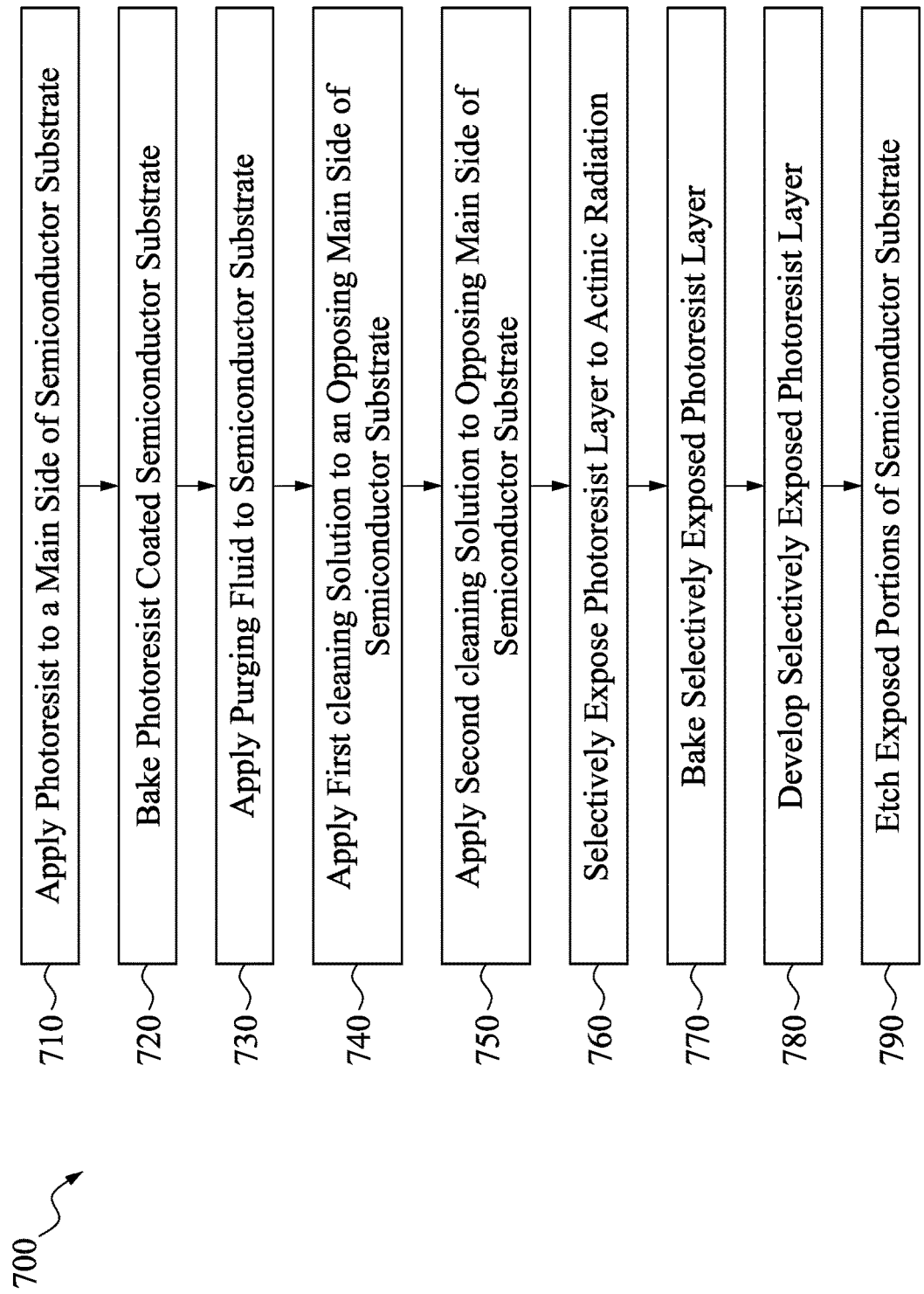
FIG. 13 is a flowchart illustrating a method of manufacturing a semiconductor device in accordance with some embodiments of the present disclosure.

FIG. 13 is a flowchart of a method 700 of method of manufacturing a semiconductor device according to some embodiments of the disclosure, including an operation 710 of applying a photoresist 80 to a main side of a semiconductor substrate 45. In operation 720, the photoresist coated semiconductor substrate 45 is baked in some embodiments. In some embodiments, the baking drives off the photoresist solvents. A purging fluid 200 is applied to the semiconductor substrate in some embodiments in operation 730. In some embodiments, the purging fluid 200 is air, nitrogen, or an inert gas. In some embodiments, the purging fluid 200 assists in cleaning contaminants from the semiconductor substrate 25.

A first cleaning solution is applied to an opposing main side of the semiconductor substrate in operation 740, and a second cleaning solution is applied to the opposing main side of the semiconductor substrate in operation 750. In some embodiments, operations 730, 740 and 750 are performed before operation 720. The first cleaning and second cleaning solutions 100 are any of the cleaning solutions disclosed herein with respect to FIG. 12 in some embodiments. The first and second cleaning solutions 100 are applied at the same time the photoresist 80 is applied to the semiconductor substrate in some embodiments.

In operation 760, the photoresist layer 80 is selectively exposed to actinic radiation to form a latent pattern in the semiconductor substantially simultaneously in some embodiments. The exposed photoresist layer undergoes a post-exposure bake in operation 770. The selectively exposed photoresist is subsequently developed in operation 780 by applying a suitable developer to the photoresist to form a pattern in the photoresist. The photoresist pattern is subsequently transferred to the semiconductor substrate or an underlayer below the photoresist layer by etching in operation 790. In some embodiments, additional semiconductor manufacturing operations are performed, including deposition operations, implant operations, and additional photolithography and etching operations to form semiconductor devices, including transistors, such as field effect transistors (FET), fin FETs (FinFETs), gate all around FETs (GAA-FETs), etc.

Figure 14:
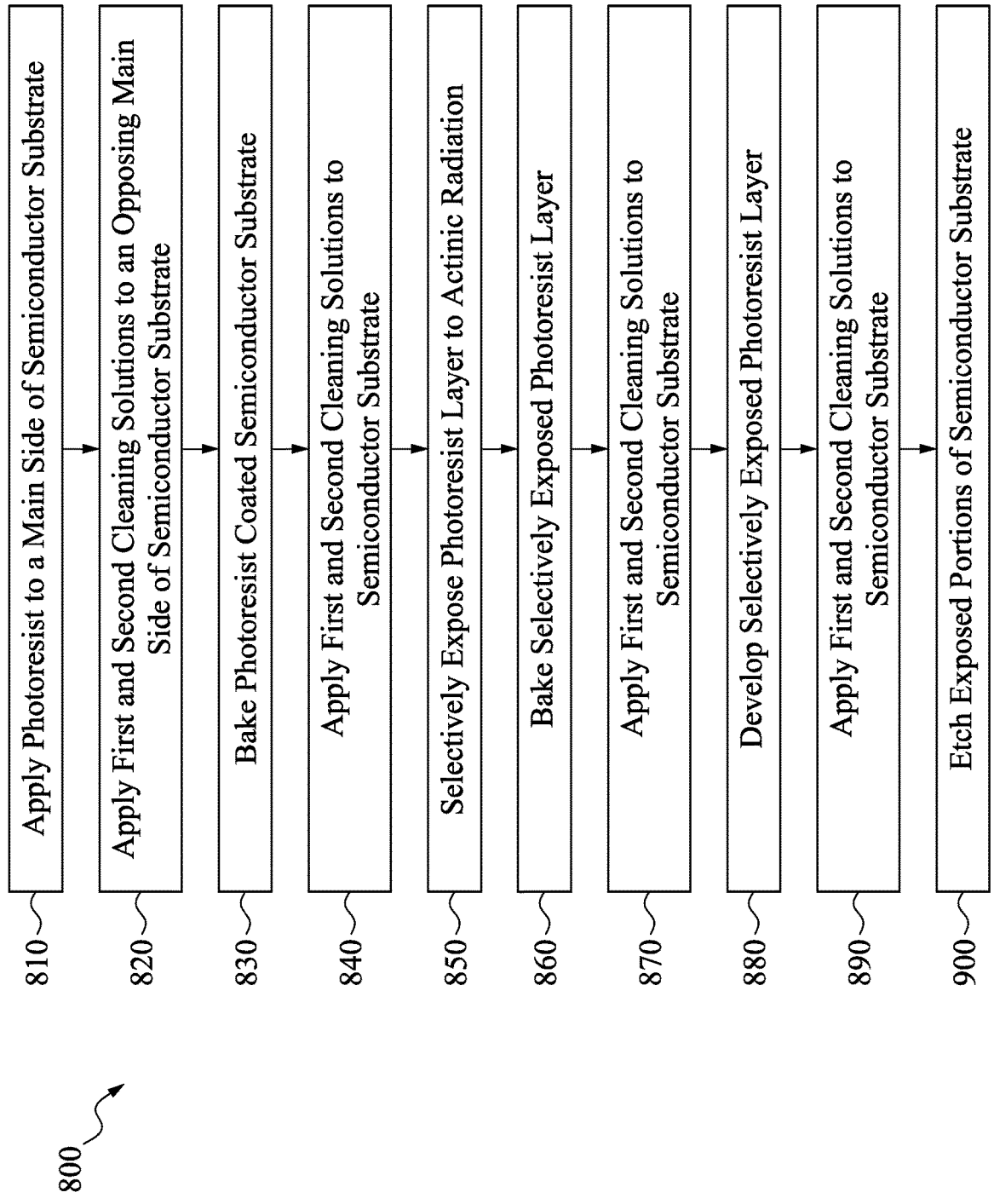
FIG. 14 is a flowchart illustrating a method of manufacturing a semiconductor device in accordance with some embodiments of the present disclosure.

FIG. 14 is a flowchart of a method 800 of method of manufacturing a semiconductor device according to some embodiments of the disclosure, including an operation 810 of applying a photoresist 80 to a main side of a semiconductor substrate 45. First and second cleaning solutions 100 are sequentially applied to an opposing main side of the semiconductor substrate 45 in operation 820. In some embodiments, operation 820 is performed at the same time as operation 810. The first cleaning solution and second cleaning solution are any of the cleaning solutions disclosed herein with respect to FIG. 12 in some embodiments. The first and second cleaning solutions 100 are applied at the same time the photoresist 80 is applied to the semiconductor substrate 45 in some embodiments.

In operation 830, the photoresist coated semiconductor substrate is baked in some embodiments. In some embodiments, the baking drives off the photoresist solvents. Then, in operation 840, the first and second cleaning solutions are again applied to the semiconductor substrate in some embodiments. In operation 850, the photoresist layer is selectively exposed to actinic radiation to form a latent pattern in the photoresist layer substantially simultaneously as the application of the cleaning solution in some embodiments. The exposed photoresist layer undergoes a post-exposure bake in operation 860. Then, in operation 870, the first and second cleaning solutions are again applied to the semiconductor substrate in some embodiments. The selectively exposed photoresist is subsequently developed in operation 880 by applying a suitable developer to the photoresist to form a pattern in the photoresist. Then, in operation 890, the first and second cleaning solutions are again applied to the semiconductor substrate in some embodiments. The photoresist pattern is subsequently transferred to the semiconductor substrate or an underlayer below the photoresist layer by etching in operation 900. In some embodiments, additional semiconductor manufacturing operations are performed, including deposition operations, implant operations, and additional photolithography and etching operations to form semiconductor devices, including transistors, such as field effect transistors (FET), fin FETs (FinFETs), gate all around FETs (GAA-FETs), etc.

Embodiments of the present disclosure reduce contamination of semiconductor substrates and subsequently formed devices. Embodiments of the present disclosure reduce contamination of semiconductor manufacturing tools. The reduction in contamination leads to improved device yield and reduced manufacturing tool downtime in some embodiments. An embodiment of the disclosure is a cleaning solution, including a first solvent having Hansen solubility parameters of $25 > \delta_d > 13$, $25 > \delta_p > 3$, and $30 > \delta_h > 4$; an acid having an acid dissociation constant, pKa, of $-11 < pKa < 4$, or a base having a pKa of $40 > pKa > 9.5$; and a surfactant. The surfactant is one or more of an ionic surfactant, polyethylene oxide and polypropylene oxide, a non-ionic surfactant, and combinations thereof. The ionic surfactant is one or more selected from the group consisting of the ionic surfactants shown in FIGS. 15A and 15B wherein R is a substituted or unsubstituted aliphatic, alicyclic, or aromatic group, and the non-ionic surfactant has an A-X or A-X-A-X structure, wherein A is an unsubstituted or substituted with oxygen or halogen, branched or unbranched, cyclic or non-cyclic, saturated C2-C100 aliphatic or aromatic group, and X includes one or more polar functional groups selected from the group consisting of —OH, =O, —S—, —P—, —P(O$_2$), —C(=O)SH, —C(=O)OH, —C(=O)OR—, —O—, —N—, —C(=O)NH, —SO$_2$OH, —SO$_2$SH, —SOH, —SO$_2$—, —CO—, —CN—, —SO—, —CON—, —NH—, —SO$_3$NH—, and SO$_2$NH. In an embodiment, a concentration of the surfactant ranges from 0.1 wt. % to 5 wt. % based on a total weight of the cleaning solution. In an embodiment, a concentration of the acid or base ranges from 0.001 wt. % to 30 wt. % based on a total weight of the cleaning solution. In an embodiment, the concentration of the acid or base ranges from 0.1 wt. % to 20 wt. % based on the total weight of the cleaning solution. In an embodiment, a surface tension of the cleaning solution is less than 40°. In an embodiment, the polyethylene oxide and polypropylene oxide are one or more selected from the group consisting of

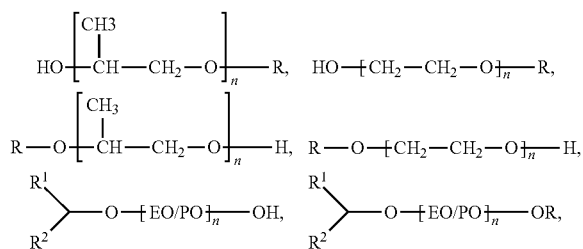

wherein R, $R^1$, and $R^2$ are same or different, and are substituted or unsubstituted aliphatic, alicyclic, or aromatic groups. In an embodiment, the non-ionic surfactant is one or more selected from the group consisting of

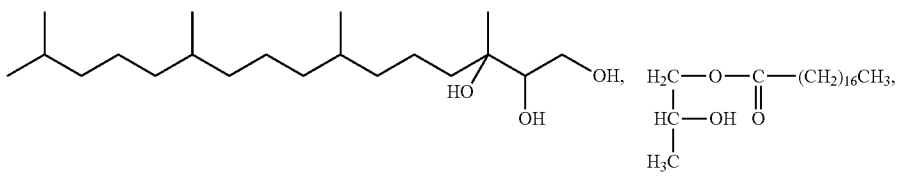

-continued

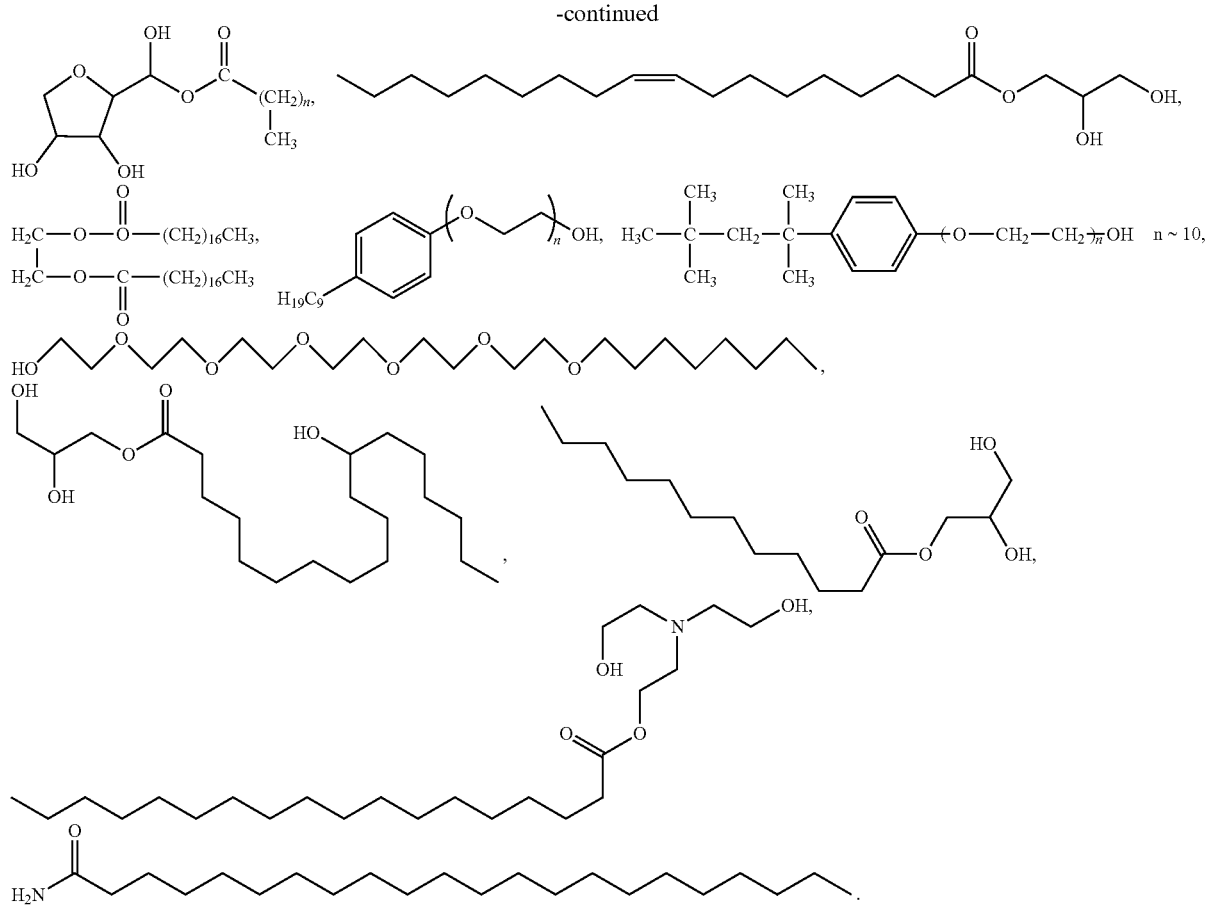

In an embodiment, a concentration of the first solvent is from 60 wt. % to 99 wt. % based on the total weight of the cleaning solution. In an embodiment, the cleaning solution includes a chelate, wherein a concentration of the chelate ranges from 0.001 wt. % to 30 wt. % based on the total weight of the cleaning solution. In an embodiment, the acid or base is an aqueous acid or aqueous base. In an embodiment, the acid or base is an organic acid or organic base.

Another embodiment of the disclosure is a method of cleaning a semiconductor substrate, including applying a first cleaning solution to a semiconductor substrate. The first cleaning solution includes a first solvent having Hansen solubility parameters of $25>\delta_d>13$, $25>\delta_p>3$, and $30>\delta_h>4$; an acid having an acid dissociation constant, pKa, of $-11<pKa<4$, or a base having a pKa of $40>pKa>9.5$; and a surfactant. The surfactant is one or more of an ionic surfactant, polyethylene oxide and polypropylene oxide, a non-ionic surfactant, and combinations thereof. The ionic surfactant is one or more selected from the group consisting of the ionic surfactants shown in FIGS. 15A and 15B wherein R is an substituted or unsubstituted aliphatic, alicyclic, or aromatic group, and the non-ionic surfactant has an A-X or A-X-A-X structure, wherein A is a unsubstituted or substituted with oxygen or halogen, branched or unbranched, cyclic or non-cyclic, saturated C2-C100 aliphatic or aromatic group, and X includes one or more polar functional groups selected from the group consisting of —OH, =O, —S—, —P—, —P(O₂), —C(=O)SH, —C(=O)OH, —C(=O)OR—, —O—; —N—, —C(=O)NH, —SO₂OH, —SO₂SH, —SOH, —SO₂—, —CO—, —CN—, —SO—, —CON—, —NH—, —SO₃NH—, and SO₂NH. In an embodiment, the first cleaning solution is applied to a first main side of the semiconductor substrate. In an embodiment, the method includes applying a photoresist to a second main side of the semiconductor substrate to form a photoresist layer on the second main side of the semiconductor substrate, wherein the second main side opposes the first main side. In an embodiment, the first cleaning solution is applied to the semiconductor substrate simultaneously with the applying the photoresist to the semiconductor substrate. In an embodiment, the first cleaning solution is applied to the semiconductor substrate after the applying the photoresist to the semiconductor substrate. In an embodiment, the method includes applying the first cleaning solution to edges of the semiconductor substrate, wherein the edges extend between the first main side and the second main side of the semiconductor substrate. In an embodiment, the method includes applying a second cleaning solution to the first main side of the semiconductor substrate, wherein the second cleaning solution has a different composition than the first cleaning solution. In an embodiment, the second cleaning solution includes a solvent having Hansen solubility parameters of $25>\delta_d>13$, $25>\delta_p>3$, and $30>\delta_h>4$. In an embodiment, the second cleaning solution is applied to the semiconductor substrate after the first cleaning solution is applied to the semiconductor substrate. In an embodiment, the method includes applying the second cleaning solution to the semiconductor substrate before applying the first cleaning solution to the semiconductor substrate. In an embodiment, the method includes applying the second cleaning solution to the edges of the semiconductor substrate. In an embodiment, the second cleaning solution further includes water, wherein the concentration of the water ranges from 0.1 wt. % to 20 wt. % based on the total weight of the second cleaning solution. In an embodiment, the second cleaning solution does not contain the surfactant. In an embodiment, a concentration of the surfactant ranges from 0.1 wt. % to 5 wt. % based on a total weight of the first cleaning solution. In an embodiment, a concentration of the acid or base ranges from 0.001 wt. % to 30 wt. % based on a total weight of the first cleaning solution. In an embodiment, the concentration of the acid or base ranges from 0.1 wt. % to 20 wt. % based on the total weight of the first cleaning solution. In an embodiment, a surface tension of the first cleaning solution is less than 40°. In an embodiment, the polyethylene oxide and polypropylene oxide are one or more selected from the group consisting of

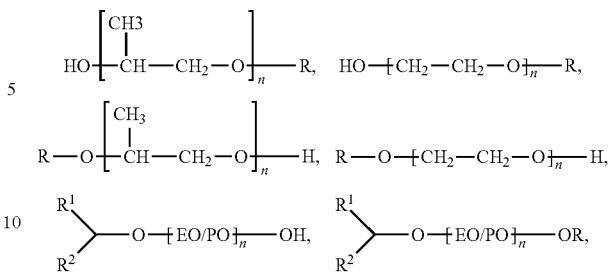

wherein R, $R^1$, and $R^2$ are same or different, and are substituted or unsubstituted aliphatic, alicyclic, or aromatic groups. In an embodiment, the non-ionic surfactant is one or more selected from the group consisting of

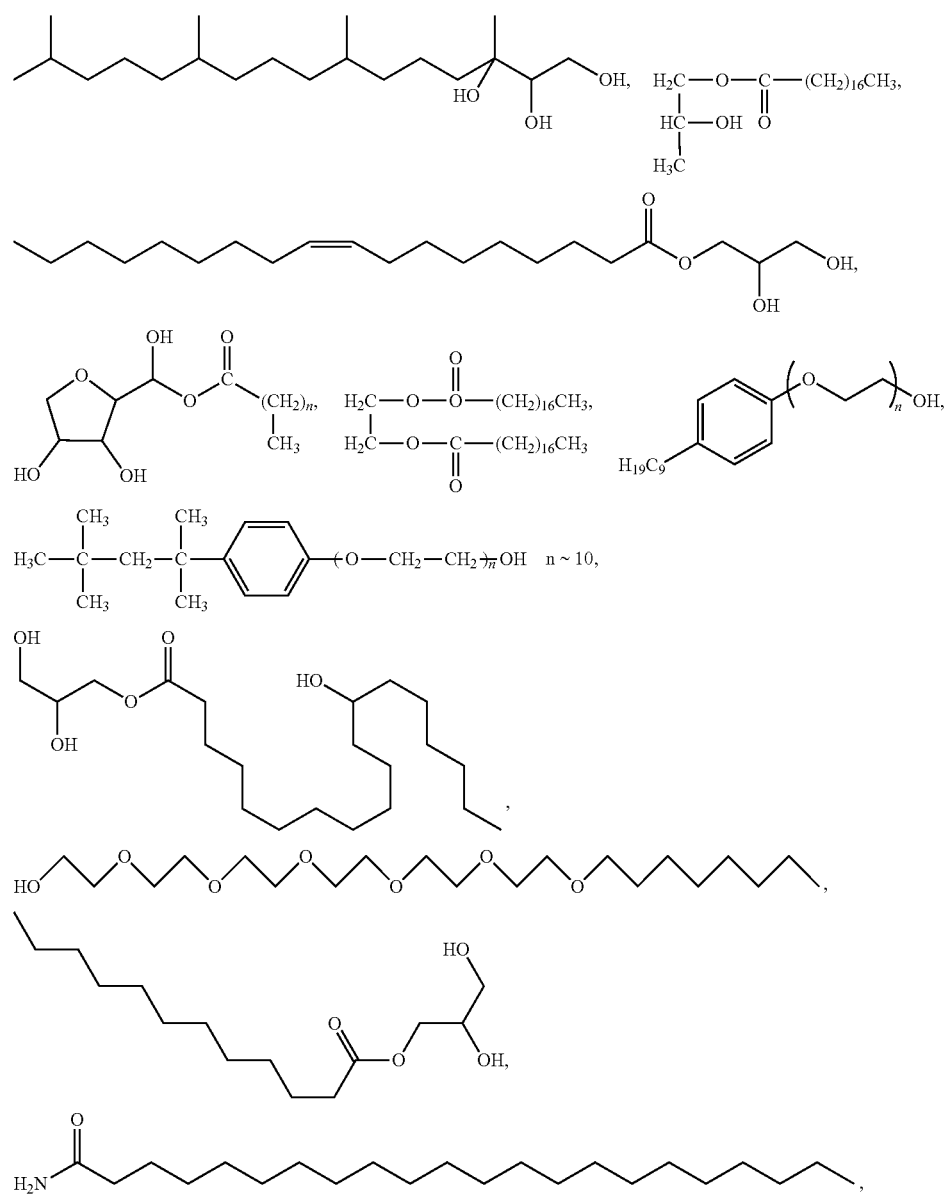

-continued

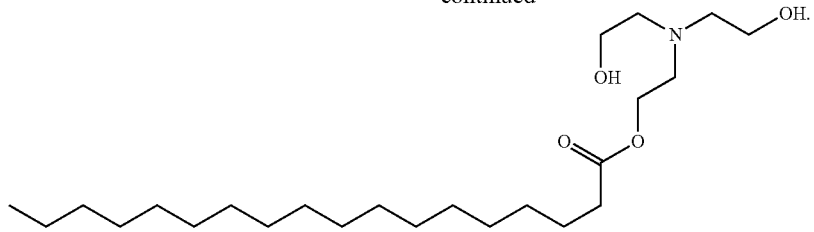

In an embodiment, a concentration of the first solvent is from 60 wt. % to 99 wt. % based on the total weight of the first cleaning solution. In an embodiment, the first cleaning solution further includes a chelate, wherein a concentration of the chelate ranges from 0.001 wt. % to 30 wt. % based on the total weight of the first cleaning solution. In an embodiment, the photoresist contains a metal. In an embodiment, the acid or base is an aqueous acid or aqueous base. In an embodiment, the acid or base is an organic acid or organic base.

Another embodiment of the disclosure is a method of manufacturing a semiconductor device, including applying a photoresist layer to a first main side of a semiconductor substrate. A first cleaning solution is applied to a second main side of the semiconductor substrate opposing the first main side. The photoresist layer is selectively exposed to actinic radiation. The first cleaning solution includes a first solvent having Hansen solubility parameters of $25>\delta_d>13$, $25>\delta_p>3$, and $30>\delta_h>4$; an acid having an acid dissociation constant, pKa, of $-11<pKa<4$, or a base having a pKa of $40>pKa>9.5$; and a surfactant. The surfactant is one or more of an ionic surfactant, polyethylene oxide and polypropylene oxide, a non-ionic surfactant, and combinations thereof. The ionic surfactant is one or more selected from the group consisting of the ionic surfactants shown in FIGS. 15A and 15B wherein R is an substituted or unsubstituted aliphatic, alicyclic, or aromatic group, and the non-ionic surfactant has an A-X or A-X-A-X structure, wherein A is an unsubstituted or substituted with oxygen or halogen, branched or unbranched, cyclic or non-cyclic, saturated C2-C100 aliphatic or aromatic group, and X includes one or more polar functional groups selected from the group consisting of —OH, =O, —S—, —P—, —P(O$_2$), —C(=O)SH, —C(=O)OH, —C(=O)OR—, —O—; —N—, —C(=O)NH, —SO$_2$OH, —SO$_2$SH, —SOH, —SO$_2$—, —CO—, —CN—, —SO—, —CON—, —NH—, —SO$_3$NH—, and SO$_2$NH. In an embodiment, the method includes developing the selectively exposed photoresist layer, thereby forming a pattern in the photoresist layer that exposes a portion of the semiconductor substrate. In an embodiment, the method includes etching exposed portions of the semiconductor substrate, thereby extending the pattern in the photoresist layer into the semiconductor substrate. In an embodiment, the semiconductor substrate is a wafer. In an embodiment, the first cleaning solution is applied to the semiconductor substrate simultaneously with the applying the photoresist to the semiconductor substrate. In an embodiment, the first cleaning solution is applied to the semiconductor substrate after the applying the photoresist to the semiconductor substrate. In an embodiment, the method includes applying the first cleaning solution to edges of the semiconductor substrate, wherein the edges extend between the first main side and the second main side of the semiconductor substrate. In an embodiment, the method includes applying a second cleaning solution to the first main side of the semiconductor substrate, wherein the second cleaning has a different composition than the first cleaning solution. In an embodiment, the second cleaning solution comprises a solvent having Hansen solubility parameters of $25>\delta_d>13$, $25>\delta_p>3$, and $30>\delta_h>4$. In an embodiment, the second cleaning solution is applied to the semiconductor substrate after the first cleaning solution is applied to the semiconductor substrate. In an embodiment, the method includes applying the second cleaning solution to the semiconductor substrate before applying the first cleaning solution to the semiconductor substrate. In an embodiment, the method includes applying the second cleaning solution to the edges of the semiconductor substrate. In an embodiment, the second cleaning solution includes water, wherein the concentration of the water ranges from 0.1 wt. % to 20 wt. % based on the total weight of the second cleaning solution. In an embodiment, the second cleaning solution does not contain the surfactant. In an embodiment, a concentration of the surfactant ranges from 0.1 wt. % to 5 wt. % based on a total weight of the first cleaning solution. In an embodiment, a concentration of the acid or base ranges from 0.001 wt. % to 30 wt. % based on a total weight of the first cleaning solution. In an embodiment, the concentration of the acid or base ranges from 0.1 wt. % to 20 wt. % based on the total weight of the first cleaning solution. In an embodiment, a surface tension of the first cleaning solution is less than 40°. In an embodiment, the polyethylene oxide and polypropylene oxide are one or more selected from the group consisting of

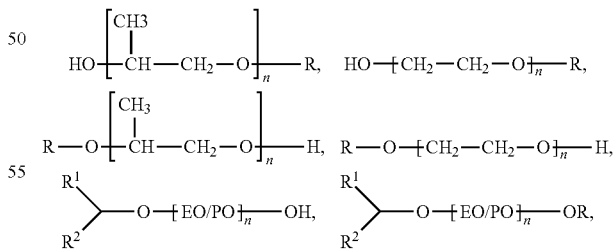

wherein R, R$^1$, and R$^2$ are same or different, and are substituted or unsubstituted aliphatic, alicyclic, or aromatic groups. In an embodiment, the non-ionic surfactant is one or more selected from the group consisting of

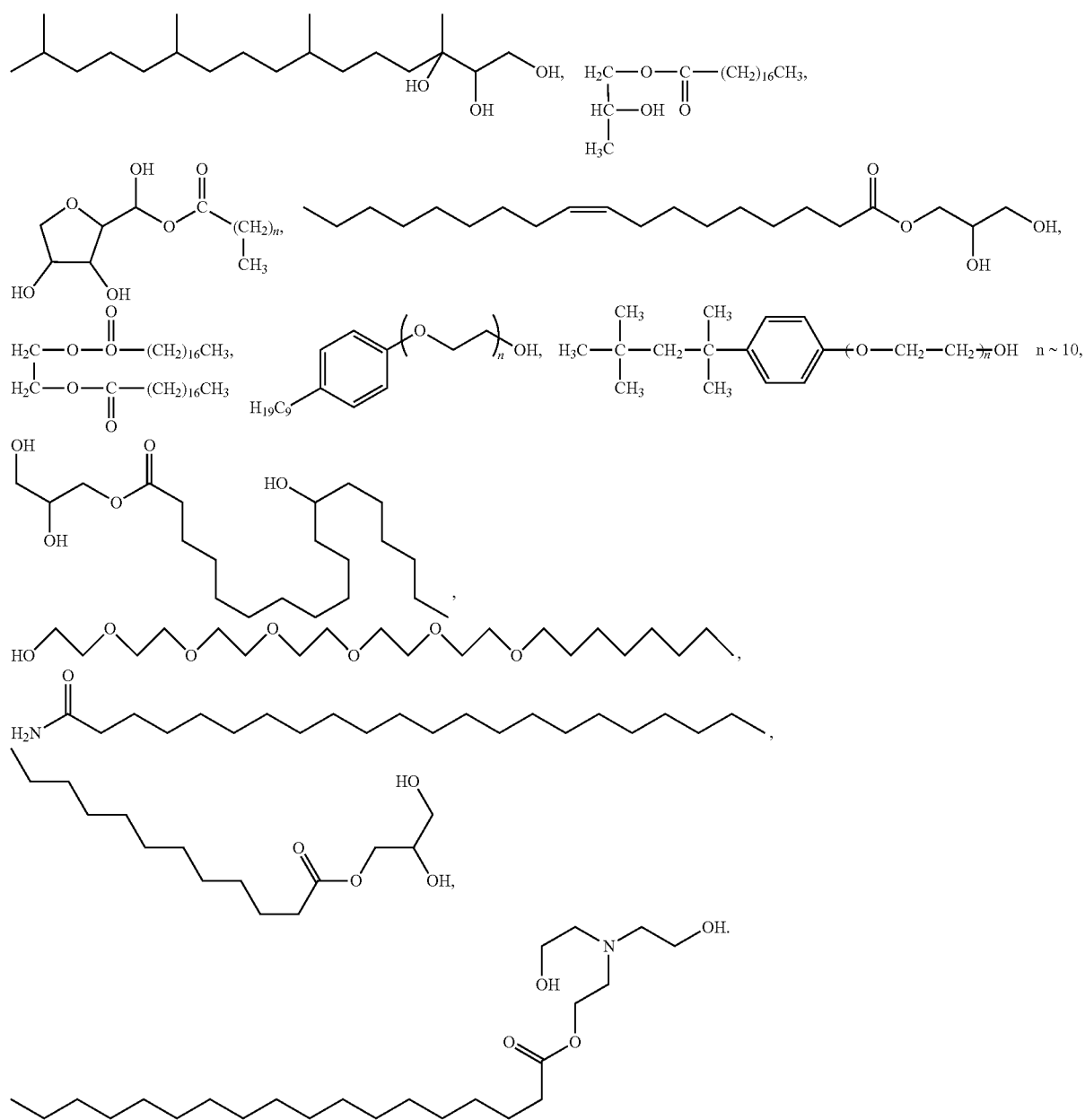

In an embodiment, a concentration of the first solvent is from 60 wt. % to 99 wt. % based on the total weight of the first cleaning solution. In an embodiment, the first cleaning solution includes a chelate, wherein a concentration of the chelate ranges from 0.001 wt. % to 30 wt. % based on the total weight of the first cleaning solution. In an embodiment, the photoresist contains a metal. In an embodiment, the acid or base is an aqueous acid or aqueous base. In an embodiment, the acid or base is an organic acid or organic base. In an embodiment, the method includes a first baking of the semiconductor substrate after applying the photoresist. In an embodiment, the method includes a second baking of the semiconductor substrate after the exposing the photoresist layer to actinic radiation. In an embodiment, the first cleaning solution is applied to the semiconductor substrate after the first baking of the semiconductor substrate. In an embodiment, the first cleaning solution is applied to the semiconductor substrate after the second baking of the semiconductor substrate. In an embodiment, the first cleaning solution is applied after the developing. In an embodiment, the second cleaning solution is applied to the semiconductor substrate after the first baking of the semiconductor substrate. In an embodiment, the second cleaning solution is applied to the semiconductor substrate after the second baking of the semiconductor substrate. In an embodiment, the second cleaning solution is applied after the developing. In an embodiment, the method includes applying a purging fluid to the semiconductor substrate. In an embodiment, the purging fluid includes air, nitrogen, or an inert gas. In an embodiment, the purging fluid is applied before the applying first cleaning solution. In an embodiment, the purging fluid is applied after the applying the first cleaning solution.

Another embodiment of the disclosure is a method of manufacturing a semiconductor device, including applying a photoresist to a first main side of a semiconductor substrate to form a photoresist layer on the first main side of the semiconductor substrate. A first cleaning solution is applied to a second main side of the semiconductor substrate opposing the first main side of the semiconductor substrate or an edge of the semiconductor substrate extending between the first main side and the second main side. A second cleaning solution is applied to the second main side of the semiconductor substrate or the sidewall extending between the first main side and the second main side. The photoresist layer is selectively exposed to actinic radiation. The first cleaning solution includes a first solvent having Hansen solubility parameters of $25>\delta_d>13$, $25>\delta_p>3$, and $30>\delta_h>4$; an acid having an acid dissociation constant, pKa, of $-11<pKa<4$, or a base having a pKa of $40>pKa>9.5$; and a surfactant. The surfactant is one or more of an ionic surfactant, polyethylene and polypropylene oxides, a non-ionic surfactant, and combinations thereof. The first cleaning solution is different from the second cleaning solution. In an embodiment, the second cleaning solution comprises a first solvent having Hansen solubility parameters of $25>\delta_d>13$, $25>\delta_p>3$, and $30>\delta_h>4$. In an embodiment, the second cleaning solution does not contain the surfactant. In an embodiment, the method includes developing the selectively exposed photoresist layer, thereby forming a pattern in the photoresist layer that exposes a portion of the semiconductor substrate. In an embodiment, the method includes etching exposed portions of the semiconductor substrate, thereby extending the pattern in the photoresist layer into the semiconductor substrate. In an embodiment, the semiconductor substrate is a wafer. In an embodiment, the first cleaning solution is applied to the semiconductor substrate simultaneously with the applying the photoresist to the semiconductor substrate. In an embodiment, the first cleaning solution is applied to the semiconductor substrate after the applying the photoresist to the semiconductor substrate. In an embodiment, the second cleaning solution is applied to the semiconductor substrate after the first cleaning solution is applied to the semiconductor substrate. In an embodiment, the method includes applying the second cleaning solution to the semiconductor substrate before applying the first cleaning solution to the semiconductor substrate. In an embodiment, the method includes a first baking of the semiconductor substrate after applying the photoresist layer. In an embodiment, the method includes a second baking of the semiconductor substrate after the exposing the photoresist layer to actinic radiation. In an embodiment, the first cleaning solution is applied to the semiconductor substrate after the first baking of the semiconductor substrate. In an embodiment, the first cleaning solution is applied to the semiconductor substrate after the second baking of the semiconductor substrate. In an embodiment, the first cleaning solution is applied after the developing. In an embodiment, the second cleaning solution is applied to the semiconductor substrate after the first baking of the semiconductor substrate. In an embodiment, the second cleaning solution is applied to the semiconductor substrate after the second baking of the semiconductor substrate. In an embodiment, the first cleaning solution is applied after the developing. In an embodiment, the method includes applying a purging fluid to the semiconductor substrate. In an embodiment, the purging fluid comprises air, nitrogen, or an inert gas. In an embodiment, the purging fluid is applied before the applying first cleaning solution. In an embodiment, the purging fluid is applied after the applying the first cleaning solution. In an embodiment, the ionic surfactant is one or more selected from the group consisting of the ionic surfactants shown in FIGS. 15A and 15B wherein R is a substituted or unsubstituted aliphatic, alicyclic, or aromatic group. In an embodiment, the non-ionic surfactant has an A-X or A-X-A-X structure, wherein A is an unsubstituted or substituted with oxygen or halogen, branched or unbranched, cyclic or non-cyclic, saturated C2-C100 aliphatic or aromatic group, and X includes one or more polar functional groups selected from the group consisting of —OH, =O, —S—, —P—, —P(O$_2$), —C(=O)SH, —C(=O)OH, —C(=O)OR—, —O—; —N—, —C(=O)NH, —SO$_2$OH, —SO$_2$SH, —SOH, —SO$_2$—, —CO—, —CN—, —SO—, —CON—, —NH—, —SO$_3$NH—, and SO$_2$NH. In an embodiment, the second cleaning solution includes water, wherein the concentration of the water ranges from 0.1 wt. % to 20 wt. % based on the total weight of the second cleaning solution. In an embodiment, a concentration of the surfactant ranges from 0.1 wt. % to 5 wt. % based on a total weight of the first cleaning solution. In an embodiment, a concentration of the acid or base ranges from 0.001 wt. % to 30 wt. % based on a total weight of the first cleaning solution. In an embodiment, the concentration of the acid or base ranges from 0.1 wt. % to 20 wt. % based on the total weight of the first cleaning solution. In an embodiment, a surface tension of the first cleaning solution is less than 40°. In an embodiment, the polyethylene and polypropylene oxides are one or more selected from the group consisting of

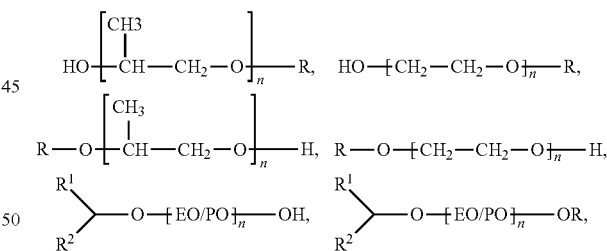

wherein R, $R^1$, and $R^2$ are same or different, and are substituted or unsubstituted aliphatic, alicyclic, or aromatic groups. In an embodiment, the non-ionic surfactant is one or more selected from the group consisting of

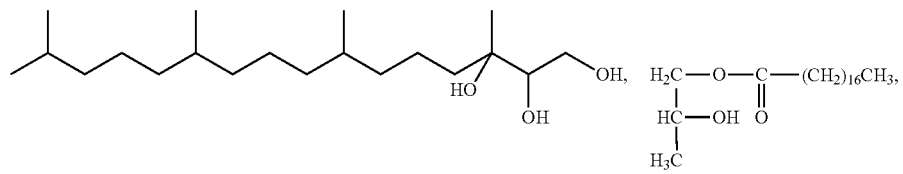

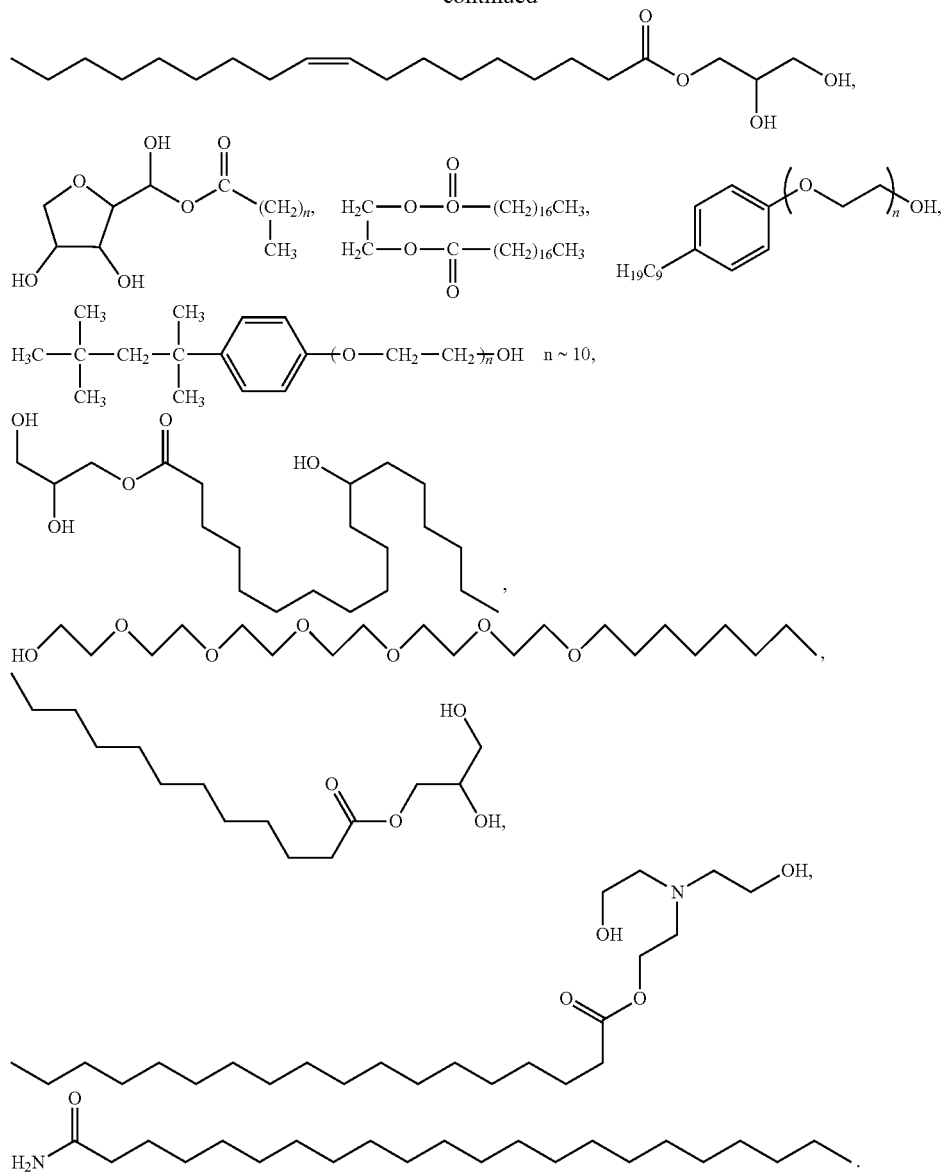

In an embodiment, a concentration of the first solvent is from 60 wt. % to 99 wt. % based on the total weight of the first cleaning solution. In an embodiment, the first cleaning solution includes a chelate, wherein a concentration of the chelate ranges from 0.001 wt. % to 30 wt. % based on the total weight of the first cleaning solution. In an embodiment, the photoresist contains a metal. In an embodiment, the acid or base is an aqueous acid or aqueous base. In an embodiment, the acid or base is an organic acid or organic base.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cleaning solution, comprising:
   a first solvent having Hansen solubility parameters of $25 > \delta_d > 13$, $25 > \delta_p > 3$, and $30 > \delta_h > 4$;
   an acid having an acid dissociation constant, pKa, of $-11 < pKa < 4$, or a base having a pKa of $40 > pKa > 9.5$; and
   a non-ionic surfactant,
   wherein the non-ionic surfactant is one or more selected from the group consisting of

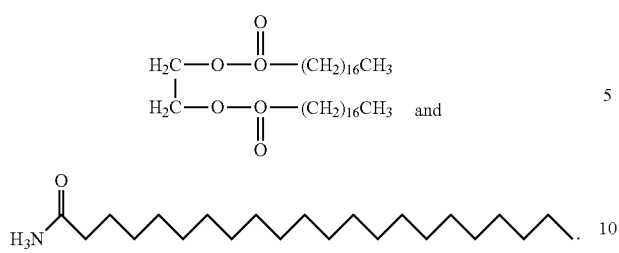

2. The cleaning solution of claim 1, wherein a concentration of the surfactant ranges from 0.1 wt. % to 5 wt. % based on a total weight of the cleaning solution.

3. The cleaning solution of claim 1, wherein a concentration of the acid or base ranges from 0.001 wt. % to 30 wt. % based on a total weight of the cleaning solution.

4. The cleaning solution of claim 3, wherein the concentration of the acid or base ranges from 0.1 wt. % to 20 wt. % based on the total weight of the cleaning solution.

5. The cleaning solution of claim 1, wherein a surface tension of the cleaning solution is less than 40°.

6. The cleaning solution of claim 1, wherein a concentration of the first solvent is from 60 wt. % to 99 wt. % based on a total weight of the cleaning solution.

7. The cleaning solution of claim 1, further comprising a chelate, wherein a concentration of the chelate ranges from 0.001 wt. % to 30 wt. % based on a total weight of the cleaning solution.

8. The cleaning solution of claim 1, further comprising an ionic surfactant.

9. A cleaning solution, comprising:
a first solvent having Hansen solubility parameters of $25>\delta_d>13$, $25>\delta_p>3$, and $30>\delta_h>4'$,
an acid, wherein the acid includes an organic acid or an inorganic acid,
when the acid includes an organic acid, the organic acid is selected from the group consisting of ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-o-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, 5-sulfosalicylic acid, trichloroacetic acid, and combinations thereof, and
when the acid includes an inorganic acid, the inorganic acid is selected from the group consisting of nitric acid, sulfuric acid, hydrochloric acid, hydrobromic acid, phosphoric acid, and combinations thereof; and
a surfactant,
wherein the surfactant is one or more of an ionic surfactant, a non-ionic surfactant, and combinations thereof, wherein the ionic surfactant is one or more selected from the group consisting of

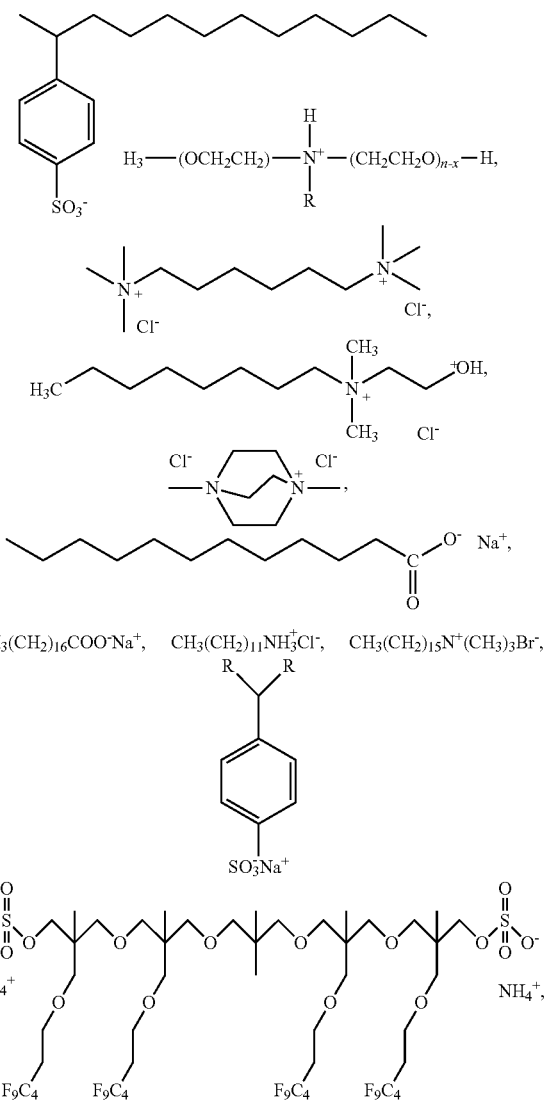

wherein R is a substituted or unsubstituted aliphatic, alicyclic, or aromatic group, and
the non-ionic surfactant has an A-X or A-X-A-X structure,
wherein when the non-ionic surfactant has the A-X-A-X structure, A is an unsubstituted or substituted with oxygen or halogen, branched or unbranched, cyclic or non-cyclic, saturated C2-C100 aliphatic or aromatic group, and
X includes one or more polar functional groups selected from the group consisting of —S—, —P—, —P(O$_2$), —C(=O)SH, —SO$_2$OH, —SO$_2$SH, —SOH, —SO$_2$—, —CO—, —CN—, —SO—, —SO$_3$NH—, and SO$_2$NH, and
wherein when the non-ionic surfactant has the A-X structure, A is an unsubstituted or substituted with oxygen or halogen, branched or unbranched, cyclic or non-cyclic, saturated C2-C100 aliphatic or aromatic group, and
X includes one or more polar functional groups selected from the group consisting of —S—, —P—, —P(O$_2$), —SO$_2$OH, —SO$_2$SH, —SOH, —SO$_2$—, —CN—, —SO—, —SO$_3$NH—, and SO$_2$NH.

10. The cleaning solution of claim 9, wherein a concentration of the surfactant ranges from 0.1 wt. % to 5 wt. % based on a total weight of the cleaning solution.

11. The cleaning solution of claim 9, wherein a concentration of the acid ranges from 0.001 wt. % to 30 wt. % based on a total weight of the cleaning solution.

12. The cleaning solution of claim 9, wherein a surface tension of the cleaning solution is less than 40°.

13. The cleaning solution of claim 9, wherein a concentration of the first solvent is from 60 wt. % to 99 wt. % based on a total weight of the cleaning solution.

14. The cleaning solution of claim 9, further comprising a chelate, wherein a concentration of the chelate ranges from 0.001 wt. % to 30 wt. % based on a total weight of the cleaning solution.

15. A cleaning solution, comprising:
a first solvent having Hansen solubility parameters of $25>\delta_d>13$, $25>\delta_p>3$, and $30>\delta_h>4$;
a base, wherein the base includes an organic base or an inorganic base, when the base includes an organic base, the organic base is selected from the group consisting of monoethanolamine, monoisopropanolamine, 2-amino-2-methyl-1-propanol, 1H-benzotriazole, 1,2,4-triazole, 1,8-diazabicycloundec-7-ene, tetrabutylammonium hydroxide, tetramethylammonium hydroxide, tetraethylammonium hydroxide, tetrapropylammonium hydroxide, and combinations thereof,
and when the base includes an inorganic base, the inorganic base is selected from the group consisting of ammonium hydroxide, ammonium sulfamate, ammonium carbamate, sodium hydroxide, potassium hydroxide, and combinations thereof; and
a surfactant,
wherein the surfactant is one or more of an ionic surfactant, a non-ionic surfactant, and combinations thereof, wherein the ionic surfactant is one or more selected from the group consisting of

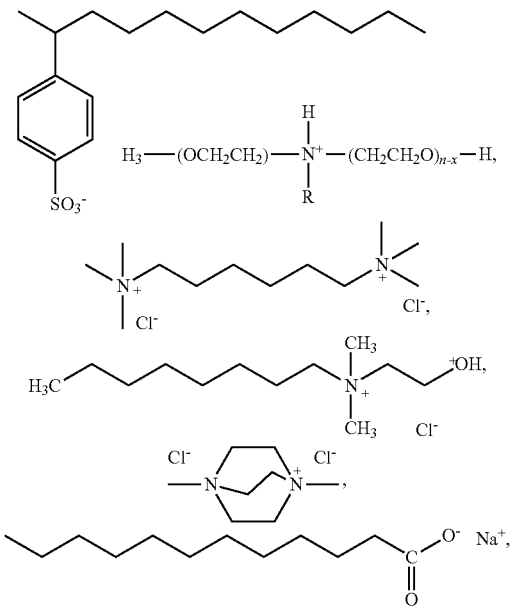

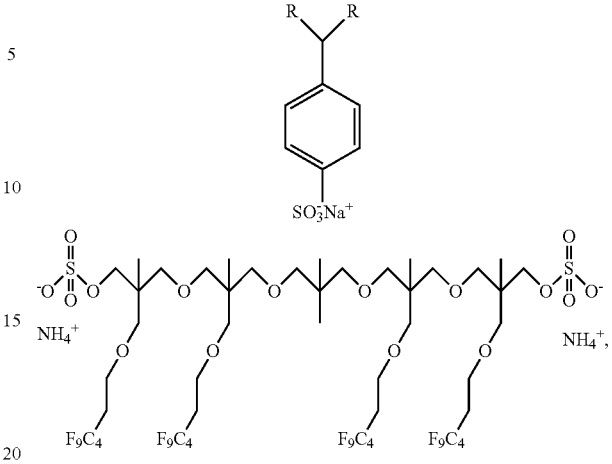

wherein R is a substituted or unsubstituted aliphatic, alicyclic, or aromatic group, and
the non-ionic surfactant has an A-X or A-X-A-X structure, wherein when the non-ionic surfactant has the A-X-A-X structure, A is an unsubstituted or substituted with oxygen or halogen, branched or unbranched, cyclic or non-cyclic, saturated C2-C100 aliphatic or aromatic group, and
X includes one or more polar functional groups selected from the group consisting of —P—, —P(O$_2$), —C(=O)SH, —SO$_2$OH, —SO$_2$SH, —SOH, —SO$_2$—, —CO—, —CN—, —SO—, —SO$_3$NH—, and SO$_2$NH, and wherein when the non-ionic surfactant has the A-X structure, A is an unsubstituted or substituted with oxygen or halogen, branched or unbranched, cyclic or non-cyclic, saturated C2-C100 aliphatic or aromatic group, and
X includes one or more polar functional groups selected from the group consisting of —S—, —P—, —P(O$_2$), —SO$_2$OH, —SO$_2$SH, —SOH, —SO$_2$—, —CN—, —SO—, —SO$_3$NH—, and SO$_2$NH.

16. The cleaning solution of claim 15, wherein a concentration of the surfactant ranges from 0.1 wt. % to 5 wt. % based on a total weight of the cleaning solution.

17. The cleaning solution of claim 15, wherein a concentration of the base ranges from 0.001 wt. % to 30 wt. % based on a total weight of the cleaning solution.

18. The cleaning solution of claim 15, wherein a surface tension of the cleaning solution is less than 40°.

19. The cleaning solution of claim 15, wherein a concentration of the first solvent is from 60 wt. % to 99 wt. % based on a total weight of the cleaning solution.

20. The cleaning solution of claim 15, further comprising a chelate, wherein a concentration of the chelate ranges from 0.001 wt. % to 30 wt. % based on a total weight of the cleaning solution.

* * * * *